US012733345B2

(12) United States Patent
Park et al.

(10) Patent No.: US 12,733,345 B2
(45) Date of Patent: Sep. 8, 2026

(54) ORGANIC LIGHT EMITTING DIODE DISPLAY DEVICE

(71) Applicant: LG DISPLAY CO., LTD., Seoul (KR)

(72) Inventors: Jae-Myeong Park, Paju-si (KR); Ho-Jun Lee, Paju-si (KR); Ji-Yeon Kim, Paju-si (KR); Hee-Won Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 595 days.

(21) Appl. No.: 18/080,578

(22) Filed: Dec. 13, 2022

(65) Prior Publication Data

US 2023/0209910 A1 Jun. 29, 2023

(30) Foreign Application Priority Data

Dec. 29, 2021 (KR) ........................ 10-2021-0191084

(51) Int. Cl.

*H10K 59/122* (2023.01)
*H10K 50/822* (2023.01)
*H10K 59/35* (2023.01)

(52) U.S. Cl.

CPC ......... *H10K 59/122* (2023.02); *H10K 50/822* (2023.02); *H10K 59/35* (2023.02)

(58) Field of Classification Search

CPC .... H10K 59/122; H10K 50/822; H10K 59/35; H10K 59/80521; H10K 59/8723; H10K 59/353; H10K 59/352; H10K 59/123; H10K 50/15; H10K 50/16; H10K 50/17; H10K 50/841

See application file for complete search history.

(56) References Cited

U.S. PATENT DOCUMENTS

| | | | |
|---|---|---|---|
| 11,296,156 | B2 | 4/2022 | Kim et al. |
| 2005/0237780 | A1 | 10/2005 | Sakai |

(Continued)

FOREIGN PATENT DOCUMENTS

| | | |
|---|---|---|
| CN | 104659070 A | 5/2015 |
| CN | 106449726 A | 2/2017 |

(Continued)

OTHER PUBLICATIONS

First Office Action dated Feb. 24, 2025 issued in corresponding Taiwan Intellectual Property Office in No. 113117938.

(Continued)

*Primary Examiner* — Steven B Gauthier
*Assistant Examiner* — Alvin L Lee
(74) *Attorney, Agent, or Firm* — Morgan, Lewis & Bockius LLP

(57) ABSTRACT

A display device having a plurality of subpixels may include: a first substrate; a bank layer on the first substrate at boundaries between the plurality of subpixels; a thin film transistor in one of the subpixels; a light emitting diode in the one of the subpixels and electrically connected to the thin film transistor, the light emitting diode including an anode, a hole transporting layer, a first emitting layer, an electron transporting layer, and a cathode; and a spacer on the bank layer at a periphery of the one of the subpixels, the spacer having a reverse taper shape. The cathode may include at least two discontinuous segments disconnected from each other at one or more side surfaces of the spacer.

33 Claims, 14 Drawing Sheets

(56) References Cited

U.S. PATENT DOCUMENTS

| | | | | |
|---|---|---|---|---|
| 2010/0051992 | A1 | 3/2010 | Kobayashi et al. | |
| 2012/0043565 | A1 | 2/2012 | Sagawa | |
| 2012/0273804 | A1 | 11/2012 | Hatano | |
| 2013/0001620 | A1 | 1/2013 | Sugisawa et al. | |
| 2014/0252321 | A1 | 9/2014 | Pyon et al. | |
| 2015/0048328 | A1 | 2/2015 | Kato et al. | |
| 2015/0379923 | A1 | 12/2015 | Lee et al. | |
| 2016/0248035 | A1 | 8/2016 | Hwang et al. | |
| 2016/0268354 | A1* | 9/2016 | Xiong | H10K 50/16 |
| 2017/0069865 | A1 | 3/2017 | Park | |
| 2018/0190731 | A1* | 7/2018 | Park | G09G 3/20 |
| 2019/0103450 | A1* | 4/2019 | Heo | H10K 50/171 |
| 2019/0165066 | A1 | 5/2019 | Lee et al. | |
| 2020/0168670 | A1 | 5/2020 | Kim et al. | |
| 2020/0168823 | A1 | 5/2020 | Kim | |
| 2020/0194510 | A1 | 6/2020 | Shin et al. | |
| 2020/0235172 | A1* | 7/2020 | Lee | G06F 3/0443 |
| 2020/0235178 | A1* | 7/2020 | Shin | H10K 59/122 |
| 2021/0280647 | A1* | 9/2021 | Han | H10K 59/352 |
| 2021/0391397 | A1 | 12/2021 | Koo et al. | |
| 2021/0408163 | A1 | 12/2021 | Heo et al. | |
| 2022/0246698 | A1* | 8/2022 | Kim | H10K 59/122 |
| 2023/0180537 | A1* | 6/2023 | Jung | H10K 59/131 |

FOREIGN PATENT DOCUMENTS

| | | | |
|---|---|---|---|
| CN | 108281462 | A | 7/2018 |
| CN | 109599426 | A | 4/2019 |
| CN | 111244132 | A | 6/2020 |
| CN | 111463238 | A | 7/2020 |
| CN | 113380857 | A | 9/2021 |
| CN | 113809131 | A | 12/2021 |
| CN | 113851509 | A | 12/2021 |
| EP | 3 660 913 | A2 | 6/2020 |
| JP | 2002208489 | A | 7/2002 |
| JP | 2005310535 | A | 11/2005 |
| JP | 2010055795 | A | 3/2010 |
| JP | 2012-43583 | A | 3/2012 |
| JP | 2012238587 | A | 12/2012 |
| JP | 2013033728 | A | 2/2013 |
| JP | 2014-232631 | A | 12/2014 |
| JP | 2015-118796 | A | 6/2015 |
| JP | 2019-102454 | A | 6/2019 |
| JP | 2020-87935 | A | 6/2020 |
| JP | 2021-197370 | A | 12/2021 |
| KR | 10-2016-0104161 | A | 9/2016 |
| KR | 10-2017-0124070 | A | 11/2017 |
| KR | 10-2017-0128741 | A | 11/2017 |
| KR | 10-2020-0076278 | A | 6/2020 |
| KR | 10-2020-0091059 | A | 7/2020 |
| TW | 201436195 | A | 9/2014 |
| TW | 202025480 | A | 7/2020 |

OTHER PUBLICATIONS

Extended European Search Report dated May 17, 2023, issued in corresponding European Patent Application No. 22208405.5.

Office Action issued Oct. 11, 2023 for counterpart Taiwanese Patent Application No. 111145283 (See English Translation).

Office Action issued Jan. 9, 2024 for counterpart Japanese Patent Application No. 2022-193198 (See English Translation).

Office Action (with partial translation) dated May 13, 2025 issued in corresponding Japan Patent Application No. 2024-100278.

Office Action dated Dec. 2, 2025, issued in corresponding Japanese Patent Application No. 2024-100278.

* cited by examiner

FIG. 4

ORGANIC LIGHT EMITTING DIODE DISPLAY DEVICE

CROSS REFERENCE TO RELATED APPLICATIONS

The present application claims the priority benefit of Republic of Korea Patent Application No. 10-2021-0191084 filed in Republic of Korea on Dec. 29, 2021, which is incorporated herein by reference in its entirety.

BACKGROUND

Technical Field

The present disclosure relates to an organic light emitting diode display device, and more particularly, to an organic light emitting diode display device where a lateral leakage current and a rise in a low level voltage are prevented or reduced.

Discussion of the Related Art

With the recent advent of multimedia, the importance of a flat panel display has increased. Accordingly, a flat panel display, such as a liquid crystal display device, a plasma display panel, and an organic light emitting diode display device, has been commercialized. Among the various flat panel displays, an organic light emitting diode (OLED) display device has been widely used due to its high response speed, high luminance, and wide viewing angle.

However, since a lateral leakage current may be generated and a low level voltage may rise in an OLED display device, its driving voltage and power consumption may increase, and the uniformity of its luminance may deteriorate.

SUMMARY

Accordingly, embodiments of the present disclosure are directed to an organic light emitting diode display device that substantially obviate one or more of problems due to the limitations and disadvantages of the related art.

An object of the present disclosure is to provide an organic light emitting display device where a lateral leakage current is minimized and rising of a low level voltage is prevented.

Additional features and advantages of the disclosure will be set forth in the description which follows, and in part will be apparent to those skilled in the art from the description or may be learned by practice of the disclosure. These and other advantages of the disclosure may be realized and attained by the structure particularly pointed out in, or derivable from, the written description, claims hereof, and the appended drawings.

To achieve these and other advantages and in accordance with the purpose of the present disclosure, as embodied and broadly described herein, a display device may include: a first substrate; a bank layer on the first substrate to define red, green, and blue subpixels; a thin film transistor in each of the red, green, and blue subpixels; a light emitting diode in the red subpixel; and a plurality of spacers on the bank layer in a periphery of the red subpixel. The light emitting diode may include an anode, a hole transporting layer, an emitting layer, an electron transporting layer, and a cathode. Each of the plurality of spacers may have a reverse taper shape. The hole transporting layer and the electron transporting layer may extend to an adjacent subpixel through side and top surfaces of each of the plurality of spacers. The cathode may be discontinuous at the side surface of each of the plurality of spacers.

In another aspect of the present disclosure, a display device having a plurality of subpixels may include: a first substrate; a bank layer on the first substrate at boundaries between the plurality of subpixels; a thin film transistor in one of the subpixels; a light emitting diode in the one of the subpixels and electrically connected to the thin film transistor, the light emitting diode including an anode, a hole transporting layer, a first emitting layer, an electron transporting layer, and a cathode; and a spacer on the bank layer at a periphery of the one of the subpixels, the spacer having a reverse taper shape. The cathode may include at least two discontinuous segments disconnected from each other at one or more side surfaces of the spacer.

In yet another aspect of the present disclosure, a display device having a plurality of subpixels may include: a first substrate; a bank layer on the first substrate at boundaries between the plurality of subpixels, the bank layer including a groove at a top surface of the bank layer in a periphery of one of the subpixels; a thin film transistor in the one of the subpixels; a first light emitting diode in the one of the subpixels and electrically connected to the thin film transistor, the first light emitting diode including an anode, an emitting layer, and a cathode. At least one of the anode and the cathode may extend on the bank layer, including side and bottom surfaces of the groove, to be connected to an adjacent one of the subpixels.

It is to be understood that both the foregoing general description and the following detailed description are explanatory and by way of examples and are intended to provide further explanation of the disclosure as claimed without limiting its scope.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIG. 4 is a cross-sectional view taken along a line IV-IV' of FIG. 3;

DETAILED DESCRIPTION

Figure 1:
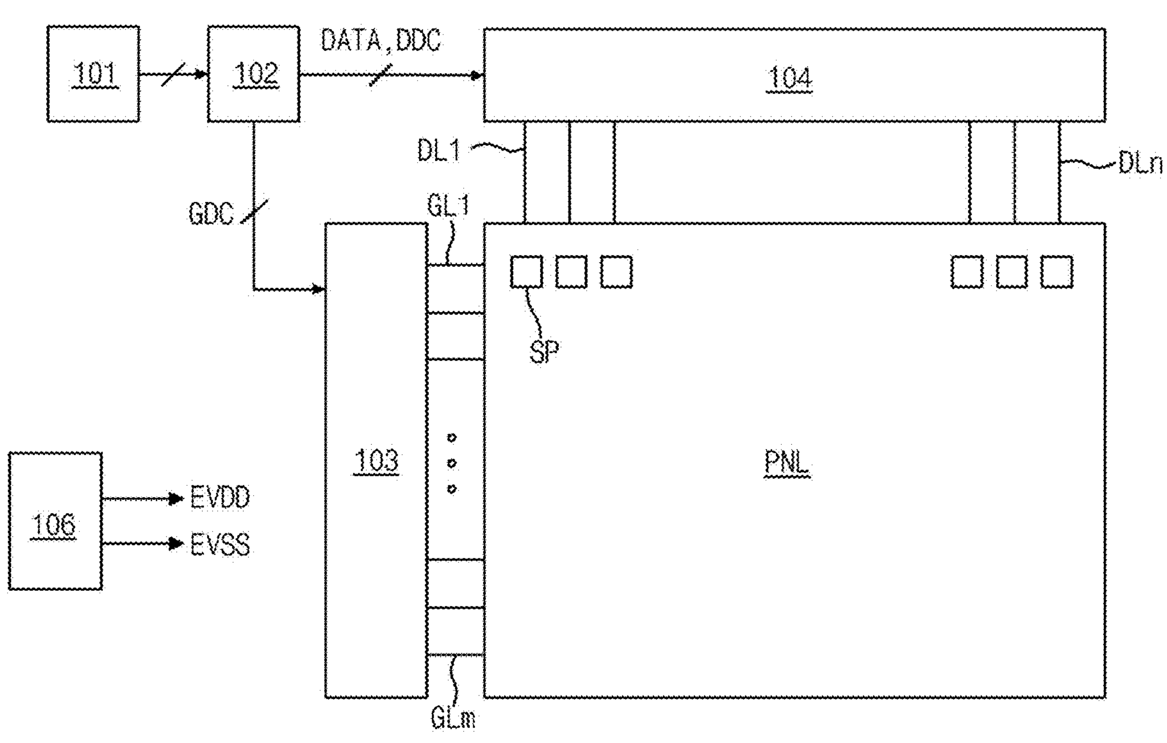
FIG. 1 is a diagram showing an organic light emitting diode display device according to a first example embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. Like reference numerals refer to like elements throughout, unless otherwise specified.

In the following description, where the detailed description of the relevant known function or configuration may unnecessarily obscure a feature or aspect of the present disclosure, a detailed description of such known function or configuration may be omitted or a brief description may be provided.

Where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is to be construed as including an error or tolerance range even where no explicit description of such an error or tolerance range is provided.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

Although the terms "first," "second," A, B, (a), (b), and the like may be used herein to refer to various elements, these elements should not be interpreted to be limited by these terms as they are not used to define a particular order or precedence. These terms are only used to distinguish one element from another. For example, a first element could be termed a second element, and, similarly, a second element could be termed a first element, without departing from the scope of the present disclosure.

Features of various embodiments of the present disclosure may be partially or entirely coupled to or combined with each other. They may be linked and operated technically in various ways as those skilled in the art can sufficiently understand. The embodiments may be carried out independently of or in association with each other in various combinations.

Hereinafter, an organic light emitting diode display device according to various example embodiments of the present disclosure will be described in detail with reference to the accompanying drawings.

FIG. 1 is a diagram showing an organic light emitting diode display device according to a first example embodiment of the present disclosure.

In FIG. 1, an organic light emitting diode (OLED) display device 100 according to a first example embodiment of the present disclosure may include an image processing unit 101, a timing controlling unit 102, a gate driving unit 103, a data driving unit 104, a power supplying unit 106, and a display panel PNL.

The image processing unit 101 may output an image data and a plurality of timing signals for driving various units. For example, the plurality of timing signals output from the image processing unit 101 may include a data enable signal, a horizontal synchronization signal, a vertical synchronization signal, and a clock signal.

The timing controlling unit 102 may receive the image data and the plurality of timing signals from the image processing unit 101. The timing controlling unit 102 may generate and output a gate control signal GDC for controlling an operation timing of the gate driving unit 103 and a data control signal DDC for controlling an operation timing of the data driving unit 104 based on the plurality of timing signals supplied from the image processing unit 101.

The gate driving unit 103 may output a scan signal to the display panel PNL in response to the gate control signal GDC supplied from the timing controlling unit 102. The gate driving unit 103 may output the scan signal through a plurality of gate lines GL1 to GLm. Although the gate driving unit 103 may be formed as an integrated circuit (IC), it is not limited thereto. Specifically, the gate driving unit 103 may have a gate-in-panel (GIP) structure where thin film transistors are formed on a substrate of the OLED display device 100. The GIP structure may include a plurality of circuits, such as a shift register and a level shifter.

The data driving unit 104 may output a data voltage to the display panel PNL in response to the data control signal DDC supplied from the timing controlling unit 102. The data driving unit 104 may sample and latch a data signal DATA of a digital type supplied from the timing controlling unit 102 and may covert the digital data signal DATA into the data voltage of an analog type based on a gamma voltage. The data driving unit 104 may output the data voltage through a plurality of data lines DL1 to DLn.

Although the data driving unit 104 may be mounted on the display panel PNL as an integrated circuit (IC) or may be laminated directly on the display panel PNL as various patterns and layers, it is not limited thereto.

The power supplying unit 106 may output and supply a high level voltage EVDD and a low level voltage EVSS to the display panel PNL. The high level voltage EVDD and the low level voltage EVSS may be supplied to the display panel PNL through respective power lines. The voltages output from the power supplying unit 106 may be transmitted to the gate driving unit 103 or the data driving unit 104 for driving the gate driving unit 103 or the data driving unit 104.

The display panel PNL may display an image in response to the scan signal, the data voltage, and the voltages supplied from the gate driving unit 103, the data driving unit 104, and the power supplying unit 106, respectively.

The display panel PNL may include a plurality of subpixels SP for displaying an image. The plurality of subpixels SP may include red, green, and blue subpixels or include white, red, green, and blue subpixels. The white, red, green and blue subpixels may have the same area as each other or may have different areas from each other.

Figure 2:
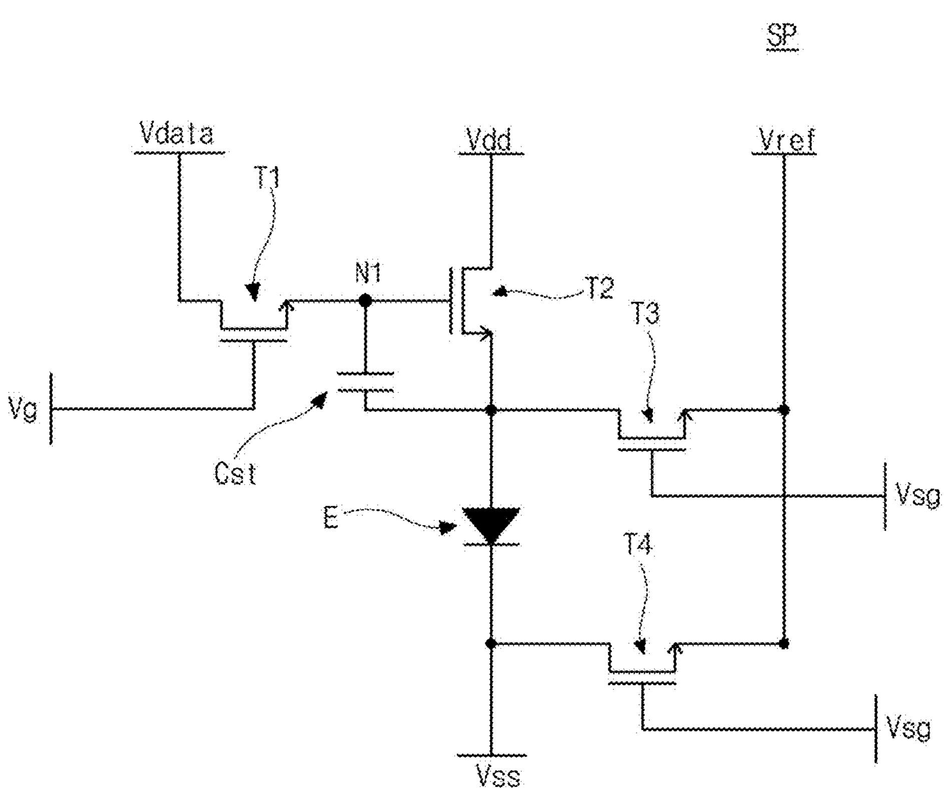
FIG. 2 is a circuit diagram showing an example subpixel of a display panel PNL of an organic light emitting diode display device according to a first example embodiment of the present disclosure.

FIG. 2 is a circuit diagram showing an example subpixel of a display panel PNL of an organic light emitting diode display device according to a first example embodiment of the present disclosure.

The display panel PNL of the OLED display device 100 may include a display area and a pad area, and the display area may include the plurality of subpixels SP. Each subpixel SP may display a single color in the OLED display device 100. For example, each subpixel SP may display one of red, green, blue, and white colors. A set of red, green, blue, and white subpixels SP may be defined as a single pixel. The plurality of subpixels SP may be disposed in a matrix on a substrate of the OLED display device 100, and a plurality of lines may be disposed between the plurality of subpixels SP in the display area.

Further, a plurality of link lines electrically connected to the plurality of lines in the display area and supplying signals to elements of the OLED display device 100 may be disposed in the pad area. For example, the plurality of link lines may include a high level voltage (Vdd) line, a data voltage (Vdata) line, a reference voltage (Vref) line, and a low level voltage (Vss) line.

In FIG. 2, each subpixel SP of the display panel PNL of the OLED display device 100 may include a switching thin film transistor (TFT) T1, a driving TFT T2, a storage capacitor Cst, a sensing TFT T3, an auxiliary TFT T4, and a light emitting diode E. Since this example subpixel SP of the OLED display device 100 includes 4 TFTs and 1 capacitor, the subpixel SP may be referred to as a 4T1C structure. However, a structure of the subpixel SP of the OLED display device 100 is not limited thereto. For example, the subpixel SP may have various other structures, such as a 4T2C structure including 4 TFTs and 2 capacitors, a 5T2C structure including 5 TFTs and 2 capacitors, a 6T2C structure including 6 TFTs and 2 capacitors, and a 7T2C structure including 7 TFTs and 2 capacitors.

Each of the 4 TFTs in the example subpixel SP may include a semiconductor layer, a gate electrode, a source electrode, and a drain electrode, and may be a positive type or a negative type. For convenience of illustration, FIG. 2 shows a negative type thin film transistor as an example, but the TFTs are not limited thereto.

The switching TFT T1 may include a drain electrode connected to the data line, a source electrode connected to a first node N1, and a gate electrode connected to the gate line. The switching TFT T1 may be turned on according to the gate voltage Vg applied to the gate line from the gate driving unit 103 and may transmit the data voltage Vdata applied through the data line from the data driving unit 104 to the first node N1.

The driving TFT T2 may include a drain electrode connected to a high level voltage (Vdd) line, a source electrode connected to an anode of the light emitting diode E, and a gate electrode connected to the first node N1. The driving TFT T2 may be turned on when a voltage of the first node N1 is greater than a threshold voltage Vth of the driving TFT T2 and may be turned off when a voltage of the first node N1 is smaller than a threshold voltage Vth. The driving TFT T2 may transmit a driving current on the high level voltage (Vdd) line to the light emitting diode E.

The storage capacitor Cst may include a first electrode connected to the first node N1 and a second electrode connected to the source electrode of the driving TFT T2. The storage capacitor Cst may maintain a voltage difference between the gate electrode and the source electrode of the driving TFT T2 constant during an emission period, when the light emitting diode E emits light, so that a constant driving current can be transmitted to the light emitting diode E.

The sensing TFT T3 may include a drain electrode connected to the source electrode of the driving TFT T2, a source electrode connected to the reference voltage (Vref) line, and a gate electrode connected to a sensing line transmitting a sensing gate voltage Vsg. The sensing TFT T3 may be a thin film transistor for sensing the threshold voltage Vth of the driving TFT T2.

The auxiliary TFT T4 may include a drain electrode electrically connected to a cathode of the light emitting diode E, a source electrode electrically connected to the reference voltage (Vref) line, and a gate electrode electrically connected to an auxiliary line transmitting the sensing gate voltage Vsg. The auxiliary TFT T4 may be turned off during an emission period to transmit the low level voltage Vss to the cathode of the light emitting diode E.

Figure 3:
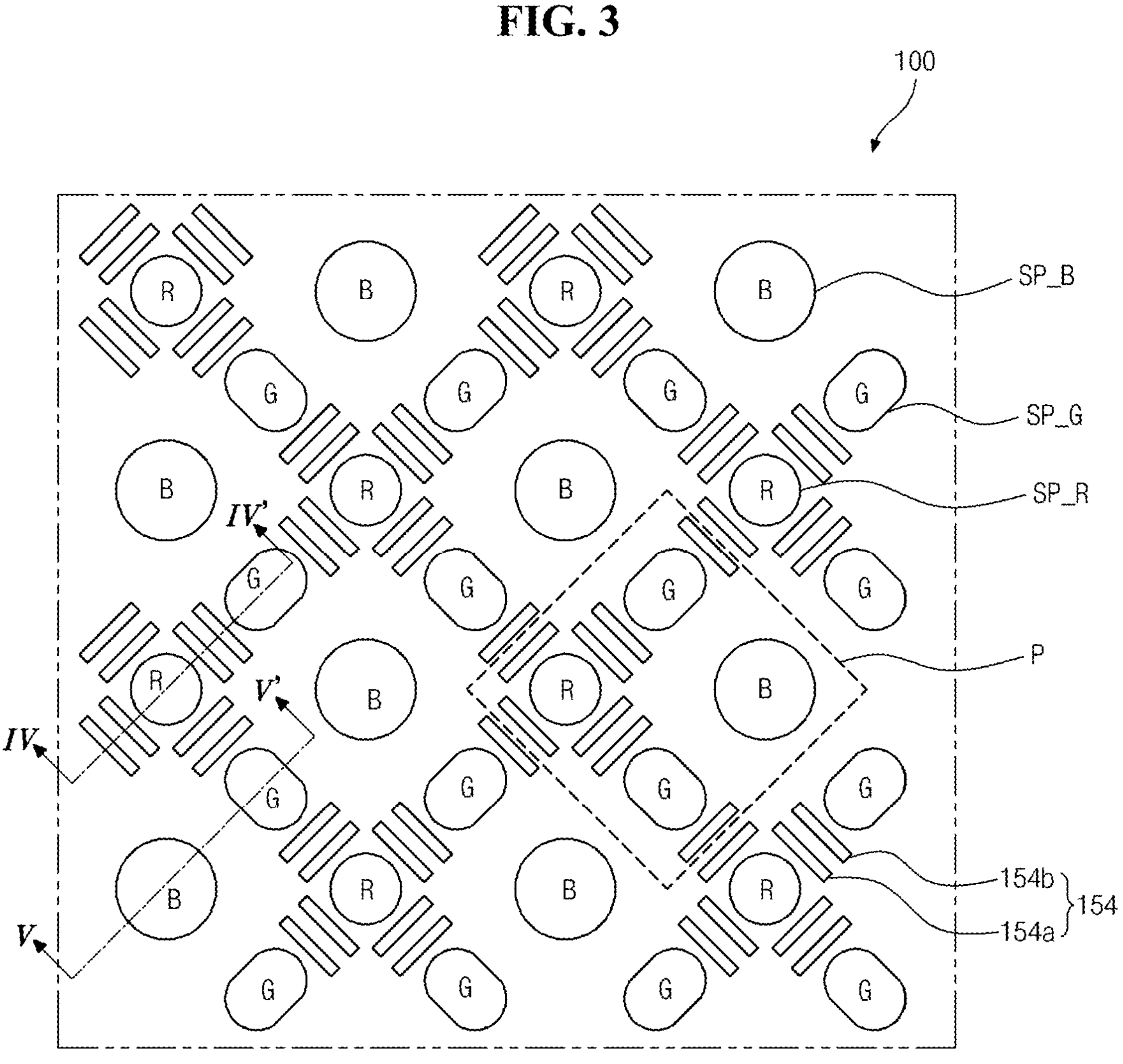
FIG. 3 is a partial plan view showing an organic light emitting diode display device according to a first example embodiment of the present disclosure.

FIG. 3 is a partial plan view showing an organic light emitting diode display device according to a first example embodiment of the present disclosure.

In FIG. 3, the OLED display device 100 may include a red subpixel SP_R, a green subpixel SP_G, and a blue subpixel SP_B. Although the red, green, and blue subpixels SP_R, SP_G, and SP_B are each illustrated as having a specific shape and as disposed in a specific arrangement in FIG. 3, they are not limited thereto. The red, green and blue subpixels SP_R, SP_G, and SP_B may have various other shapes and may be disposed in various other arrangements in other example embodiments.

A plurality of spacers 154 each having a reverse taper shape in a cross-sectional view may be disposed in a periphery of the red subpixel SP_R, without being otherwise disposed in a periphery of the green and blue subpixels SP_G and SP_B. In each spacer 154 having a reverse taper shape, a width of a top portion (top surface) may be greater than a width of the bottom portion (bottom surface).

The plurality of spacers 154 each having a bar shape in a plan view may be disposed in four peripheral sides of the red subpixel SP_R to surround the red subpixel SP_R. The plurality of spacers 154 surrounding the red subpixel SP_R may be spaced apart from each other. Although four spacers 154 are illustrated as disposed in a rectangular shape and the red subpixel SP_R is illustrated as disposed in the rectangular shape in FIG. 3, they are not limited to the illustrated example. The spacers 154 equal to or greater than five in number may be disposed in a polygonal shape or a circular shape, and the red subpixel SP_R may be disposed in the polygonal shape or the circular shape in other example embodiments.

Although each of the plurality of spacers 154 may include two of first and second sub-spacers 154*a* and 154*b* spaced apart from each other as illustrated in FIG. 3, it is not limited thereto. For example, each of the plurality of spacers 154 may include one sub-spacer or three or more sub-spacers in other example embodiments. As a result, a plurality of first sub-spacers 154*a* and a plurality of second sub-spacers 154*b* may be disposed in a periphery of the red subpixel SP_R.

Figure 4:
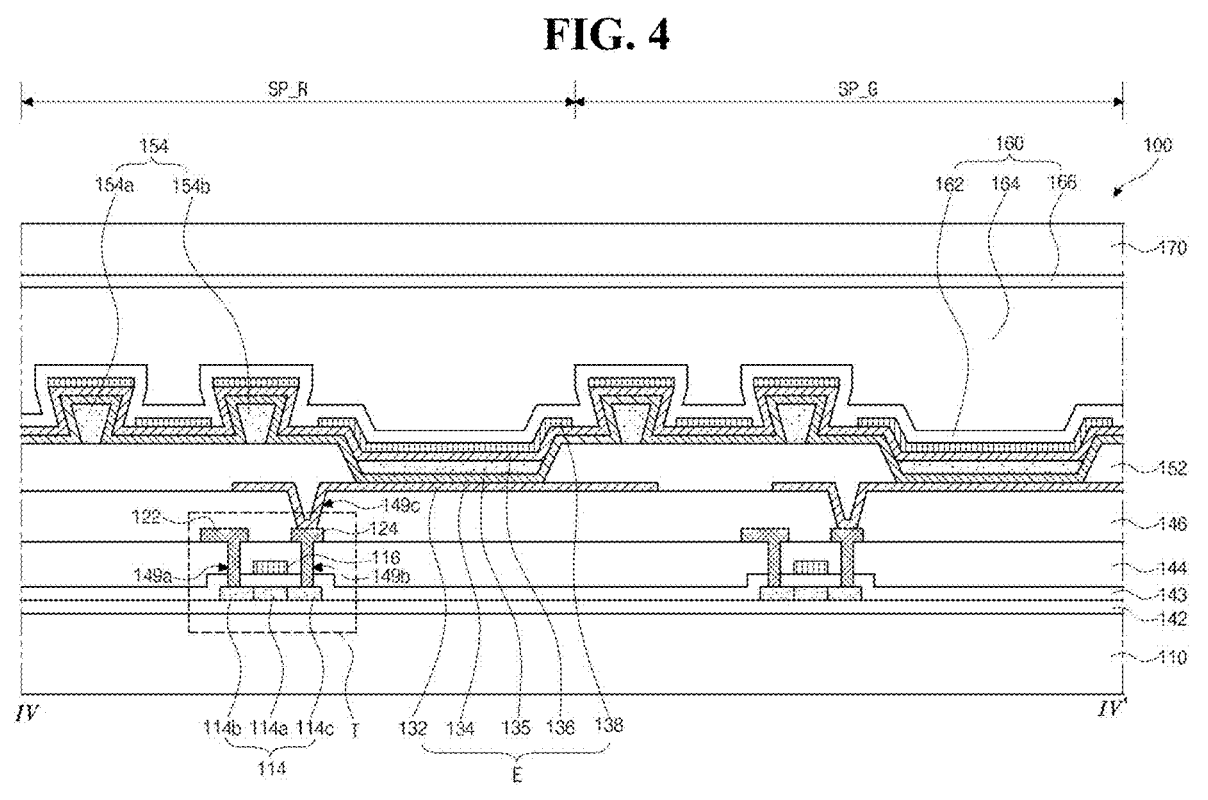
Figure 5:
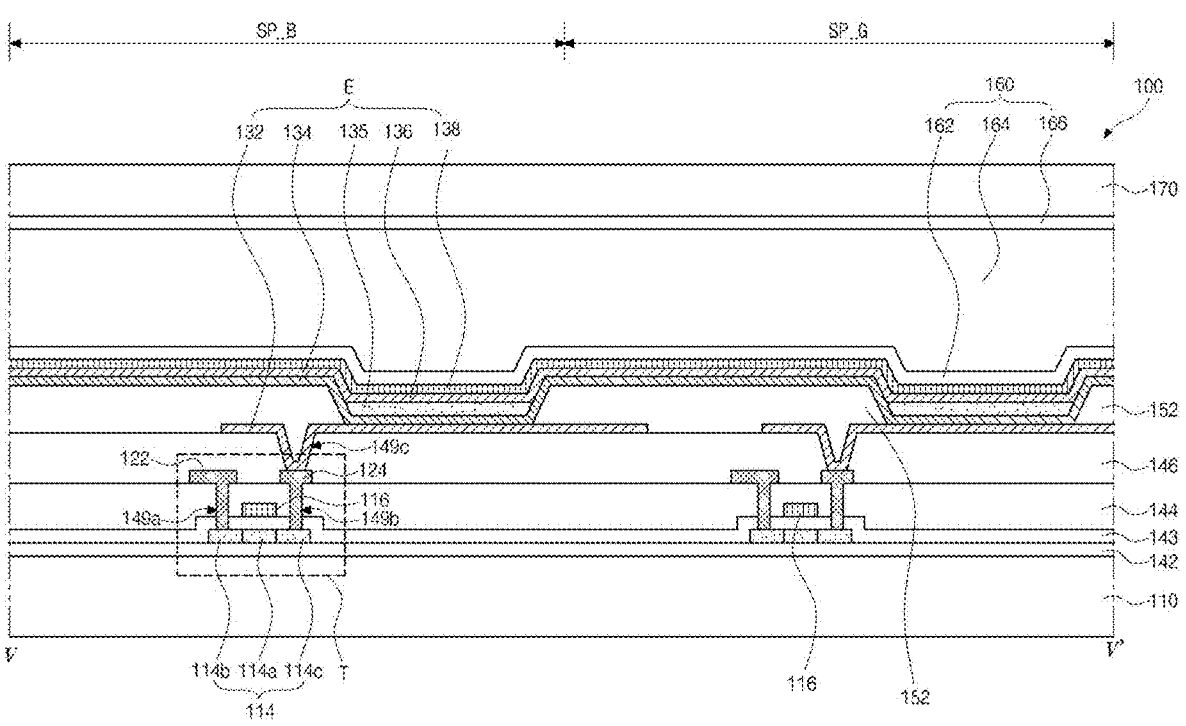
FIG. 5 is a cross-sectional view taken along a line V-V' of FIG. 3.
Figure 6:
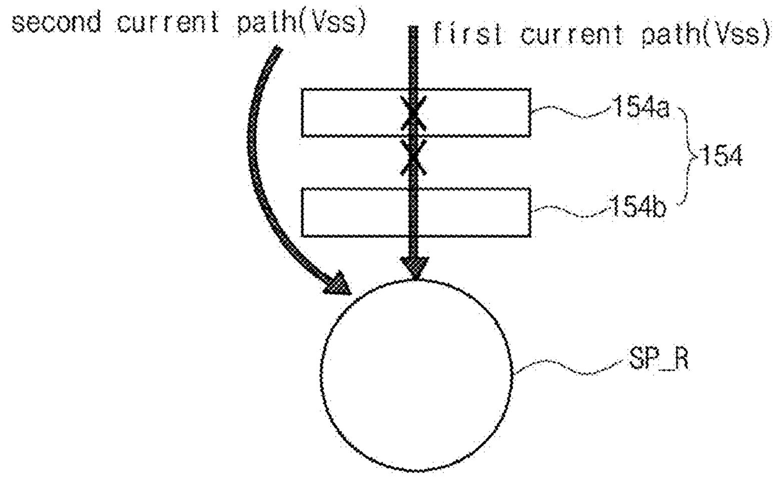
FIG. 6 is a view showing current paths of a low level voltage of an organic light emitting diode display device according to a first example embodiment of the present disclosure.

FIG. 4 is a cross-sectional view taken along a line IV-IV' of FIG. 3, and FIG. 5 is a cross-sectional view taken along a line V-V' of FIG. 3. FIG. 4 shows the red subpixel SP_R and the green subpixel SP_G adjacent to each other, and FIG. 5 shows the blue subpixel SP_B and the green subpixel SP_G adjacent to each other. FIG. 6 is a view showing current paths of a low level voltage of an organic light emitting diode display device according to a first example embodiment of the present disclosure.

In FIGS. 4 and 5, a thin film transistor (TFT) T may be disposed in each of the red, green, and blue subpixels SP_R, SP_G and SP_B. Although a plurality of TFTs, such as the switching TFT, the driving TFT, the sensing TFT, and the auxiliary TFT, may be disposed in each of the red, green, and blue subpixels SP_R, SP_G and SP_B, one TFT T is shown for convenience of illustration. As a result, the one illustrated TFT T may be one of the switching TFT, the driving TFT, the sensing TFT, and the auxiliary TFT.

Since the switching TFT, the driving TFT, the sensing TFT, and the auxiliary TFT may have the same structure as each other, the one illustrated TFT T may represent the structure of the plurality of TFTs.

The TFT T may include a semiconductor layer 114 on a buffer layer 142 over a first substrate 110, a gate insulating layer 143 covering the semiconductor layer 114 on the buffer layer 142, a gate electrode 116 on the gate insulating layer 143, an interlayer insulating layer 144 covering the gate electrode 116 over the gate insulating layer 143, and source and drain electrodes 122 and 124 on the interlayer insulating layer 144.

The first substrate 110 may include a foldable plastic. For example, the first substrate 110 may include one of polyimide (PI), polyethylene terephthalate (PET), polyethylene naphthalate (PEN), polycarbonate (PC), polyethersulfone (PES), polyarylate (PAR), polysulfone (PSF), and cyclic-olefin copolymer (COC). However, the first substrate 110 is not limited to the foldable material, and the first substrate 110 may include a hard material, such as a glass.

The buffer layer 142 may protect the TFT T from an impurity, such as an alkali ion leaked from the first substrate 110, or may block moisture injected from an exterior. The buffer layer 142 may have a single layer or multiple layers of silicon oxide (SiOx) or silicon nitride (SiNx).

The semiconductor layer 114 may include an amorphous semiconductor material, such as amorphous silicon (a-Si), a polycrystalline semiconductor material, such as polycrystalline silicon (p-Si), and an oxide semiconductor material, such as indium gallium zinc oxide (IGZO). The semiconductor layer 114 may include a channel region 114*a* of a central portion and source and drain regions 114*b* and 114*c* of a doped impurity at respective sides of the channel region 114*a*.

Although the gate electrode 116 may have a single layer or multiple layers of a metallic material, such as chromium (Cr), molybdenum (Mo), tantalum (Ta), copper (Cu), titanium (Ti), aluminum (Al), or aluminum alloy, it is not limited thereto.

The interlayer insulating layer 144 may include an organic material, such as photoacryl, or may have a single layer or multiple layers of an inorganic material, such as silicon nitride (SiNx) or silicon oxide (SiOx). In addition, the interlayer insulating layer 144 may have multiple layers of an organic layer and an inorganic layer.

Source and drain electrodes 122 and 124 may be connected to the source and drain regions 114*b* and 114*c*, respectively, of the semiconductor layer 114 through first and second contact holes 149*a* and 149*b* in the gate insulating layer 143 and the interlayer insulating layer 144.

Although not shown, a bottom shield metal layer may be disposed under the semiconductor layer 114 on the first substrate 110. The bottom shield metal layer may prevent deterioration of the TFT T and a residual image by minimizing a back channel phenomenon due to charges trapped in the first substrate 110. Although the bottom shield metal layer may have a single layer or multiple layers of titanium (Ti), molybdenum (Mo), or an alloy thereof, it is not limited thereto.

A passivation layer 146 may be disposed on the TFT T and the entire first substrate 110. The passivation layer 146 may include an organic material, such as photoacryl. Alternatively, the passivation layer 146 may have multiple layers of an inorganic layer and an organic layer. The passivation layer 146 may have a third contact hole 149*c* exposing the drain electrode 124.

An anode 132 of the light emitting diode E electrically connected to the drain electrode 124 of the TFT T through the third contact hole 149*c* may be disposed on the passivation layer 146 in each of the red, green, and blue subpixels SP_R, SP_G, and SP_B. The anode 132 may have a single layer or multiple layers of a metallic material, such as calcium (Ca), barium (Ba), magnesium (Mg), aluminum (Al), and silver (Ag) or an alloy thereof. The anode 132 may be connected to the drain electrode 124 of the TFT T, and an image signal may be applied to the anode 132.

A bank layer 152 may be disposed in a boundary region of each of the red, green, and blue subpixels SP_R, SP_G, and SP_B. The bank layer 152 may be a sidewall defining a corresponding one of the red, green, and blue subpixels SP_R, SP_G, and SP_B and may prevent a mixture of colored lights emitted from the red, green and blue subpixels SP_R, SP_G, and SP_B by dividing the red, green and blue subpixels SP_R, SP_G and SP_B.

The reverse-tapered spacer 154 may be disposed on the bank layer 152 in a periphery of the red subpixel SP_R. Although the spacer 154 is illustrated as including the first and second sub-spacers 154*a* and 154*b* spaced apart from each other in FIG. 4, the spacer 154 may include one sub-spacer or three or more sub-spacers in other example embodiments. As shown for example in FIG. 5, the spacer 154 may not be disposed in a region not adjacent to the red subpixel SP_R (e.g., a region between the green and blue subpixels SP_G and SP_B).

Although the bank layer 152 may include polyimide (PI) or photoresist, it is not limited thereto. The spacer 154 may have the same material as the bank layer 152 or may have a different material from the bank layer 152. For example, in embodiments where the spacer 154 and the bank layer 152 include the same material as each other, the spacer 154 and the bank layer 152 may be formed through a single mask process.

A hole transporting layer 134 may be disposed on the anode 132 between the adjacent bank layers 152, on a top surface of the bank layer 152, and on side and top surfaces of the spacer 154. An emitting layer 135 may be disposed on the hole transporting layer 134 between the adjacent bank layers 152. The emitting layer 135 may include a red emitting layer emitting a red colored light in the red subpixel SP_R, a green emitting layer emitting a green colored light in the green subpixel SP_G, and a blue emitting layer emitting a blue colored light in the blue subpixel SP_B. Alternatively, the emitting layer 135 may include a white emitting layer emitting a white colored light in the red, green, and blue subpixels SP_R, SP_G, and SP_B. Also, in one or more of the red, green, and blue subpixels SP_R, SP_G, and SP_B, two or more stacks of emitting layers 135 overlapping one another may be disposed on the hole transporting layer 134 between the adjacent bank layers 152, with a charge generation layer (not shown) interposed between the two or more stacks of emitting layers 135.

An electron transporting layer 136 may be disposed on the emitting layer 135 between the adjacent bank layer 152, on the hole transporting layer 134 over the top surface of the bank layer 152, and on the hole transporting layer 134 over the side and top surfaces of the spacer 154.

A cathode 138 may be disposed on the electron transporting layer 136 between the adjacent bank layers 152, on the electron transporting layer 136 over the top surface of the bank layer 152, and on the electron transporting layer 136 over the top surface of the spacer 154. The cathode 138 may not also be disposed on the electron transporting layer 136 over the side surface of the spacer 154. Although the cathode 138 may be disposed over the top surface of the bank layer 152 and the top surface of the spacer 154, the cathode 138 may not also be disposed over the side surface of the reverse-tapered spacer 154. As a result, the cathode 138 over the top surface of the bank layer 152 and the cathode 138 over the top surface of the spacer 154 may be cut in discontinuous segments due to the side surface of the reverse-tapered spacer 154.

Although not shown, a hole injecting layer may be disposed between the anode 132 and the hole transporting layer 134, and an electron injecting layer may be disposed on the electron transporting layer 136.

The anode 132, the hole transporting layer 134, the emitting layer 135, the electron transporting layer 136, and the cathode 138 may constitute the light emitting diode E emitting a light of a predetermined wavelength according to a signal applied from an exterior. As discussed above, the light emitting diode E may alternatively include two or more stacks of emitting layers 135 overlapping one another, with a charge generation layer (not shown) interposed between the two or more stacks of emitting layers 135

In the OLED display device 100 according to a first example embodiment of the present disclosure, since the hole transporting layer 134 and the electron transporting layer 136 may be disposed on the side and top surfaces of the spacer 154, the hole transporting layer 134 and the electron transporting layer 136 may be disposed on an entire surface of the OLED display device 100. The cathode 138 may be cut in discontinuous segments due to the spacer 154.

As a result, a current path through the hole transporting layer 134 may be elongated, and a lateral leakage current may be reduced.

When the subpixel is driven to have an on state in the OLED display device 100, a lateral leakage current may be generated and be transmitted to the adjacent subpixel. Since the lateral leakage current may cause an error in a current of the adjacent subpixel, the uniformity of luminance between the subpixels may deteriorate. In addition, the adjacent subpixel having an off state may be turned on to emit light due to the lateral leakage current. Specifically, since a gap distance between the subpixels is reduced in a high resolution display device, an undesirable influence of the lateral leakage current may increase.

The lateral leakage current may flow through a common layer, such as the hole transporting layer 134, the electron transporting layer 136, the hole injecting layer, and the electron injecting layer, to be transmitted to the adjacent subpixel. In the OLED display device 100 according to example embodiments of the present disclosure, a transmission of the lateral leakage current to the adjacent subpixel may be minimized by adjusting a current path of the lateral leakage current.

Since the hole transporting layer 134 and the electron transporting layer 136 may be disposed on the side and top surfaces of the spacer 154, the current path of the lateral leakage current may be elongated. As a result, the lateral leakage current transmitted to the adjacent subpixel may be minimized due to an increase in the length of the current path.

The cathode 138 may be formed of a transparent conductive material, such as indium tin oxide (ITO) and indium zinc oxide (IZO), or a metallic material of a thin thickness which a visible ray passes through. As a result, the transparent conductive material or the metallic material may not be formed on the side surfaces of the reverse-tapered spacer 154 during a forming process for the cathode 138, such as a sputtering process.

Accordingly, the cathode 138 over the OLED display device 100 may be cut into discontinuous segments in a region of the spacer 154, and an increase in the length of a current path of the low level voltage Vss may be prevented. The current of the low level voltage Vss may flow through the cathode 138. The increase in the length of the current path of the low level voltage Vss may cause a rise in the low level voltage Vss, which may cause the driving voltage and power consumption to increase and the uniformity of luminance to deteriorate.

If the cathode 138 is not cut into discontinuous segments by the spacer 154, the cathode 138 may extend to the side and top surfaces of the spacer 154. As a result, the current path of the low level voltage Vss may be elongated, and the low level voltage Vss may rise.

In the OLED display device 100 according to example embodiments of the present disclosure, the cathode 138 may be cut into discontinuous segments in the region of the reverse-tapered spacer 154 to prevent or mitigate the potential rise in the low level voltage Vss. Since the current path of the low level voltage Vss may be prevented from being formed on the top and side surfaces of the first spacer 154*a* and on the top and side surfaces of the second spacer 154*b,* the increase in the length of the current path of the low level voltage Vss may be minimized due to the spacer 154.

In the OLED display device 100 according to a first example embodiment of the present disclosure, the spacer 154 having a reverse taper shape may be disposed on the bank layer 152. As a result, the current path of the lateral leakage current may be elongated, and the lateral leakage current to the adjacent subpixel may be minimized. Further, the increase in the length of the current path of the low level voltage Vss may be minimized, and the potential rise in the low level voltage Vss may be minimized.

In the OLED display device 100 according to a first example embodiment of the present disclosure, the spacer 154 may be disposed in a periphery of the red subpixel SP_R and not in a periphery of the green and blue subpixels SP_G and SP_B.

When the reverse-tapered spacer 154 is disposed on the bank layer 152, the cathode 138 may be cut into discontinuous segments in the region of the spacer 154. However, the current path may be elongated as compared with a comparison example where the spacer 154 is omitted.

In FIG. 6, since a first current path of the low level voltage Vss passing through the spacer 154 is cut or disconnected due to the reverse-tapered spacer 154, the current of the low level voltage Vss is not transmitted to the red subpixel SP_R through the first current path of the low level voltage Vss. Instead, the current of the low level voltage Vss may be transmitted to the red subpixel SP_R through a second current path of the low level voltage Vss outside the spacer 154. Since a length of the current path of the low level voltage Vss increases as compared with a comparison example not having the spacer 154 and having the current of the low level voltage Vss transmitted through the first current path, a property of the OLED display device 100 may deteriorate due to a rise in the low level voltage.

As a result, if the reverse-tapered spacer 154 is disposed on the bank layer 152, the OLED display device 100 may have an advantage in that the lateral leakage current may decrease but may have a disadvantage in that the low level voltage may rise.

In the OLED display device 100 according to a first example embodiment of the present disclosure, the advantage the lateral leakage current decreases is maximized and the disadvantage that that the low level voltage increases is minimized. As a result, an efficiency of the OLED display device 100 may be improved.

Among the red, green, and blue subpixels SP_R, SP_G and SP_B, a relatively low current may be applied to the red subpixel SP_R, and a relatively high current may be applied to the green and blue subpixels SP_G and SP_B. The TFT T in the red subpixel SP_R may have a relatively low threshold voltage, and the TFT T in the green and blue subpixels SP_G and SP_B may have a relatively high threshold voltage.

As a result, in the red subpixel SP_R, the current may have a relatively large variation, and the luminance may have a relatively large amount of change even when a relatively small amount of lateral leakage current is applied. In addition, the red subpixel SP_R having an off state may emit light due to a relatively small amount of lateral leakage current. In the green and blue subpixels SP_G and SP_B, the current may have a relatively small variation, and the luminance may have a relatively small amount of change when a relatively small amount of lateral leakage current is applied. In addition, the green and blue subpixels SP_G and SP_B having an off state may not emit light due to a relatively small amount of lateral leakage current. Thus, the lateral leakage current may have a relatively large impact on the red subpixel SP_R but may have a relatively small impact on the green and blue subpixels SP_G and SP_B.

Accordingly, in the green and blue subpixels SP_G and SP_B, deterioration due to the lateral leakage current may not occur or may be insignificant even if the spacer 154 is not disposed in their periphery.

In the OLED display device 100, the spacer 154 may be disposed in the periphery of the red subpixel SP_R which may otherwise receive a relatively large influence from the lateral leakage current. On the other hand, and the spacer 154 may not also be disposed in the periphery of the green and blue subpixels SP_G and SP_B which may receive a relatively small amount of influence from the lateral leakage current. As a result, deterioration of the OLED display device 100 due to the lateral leakage current may be prevented or reduced.

Further, since the spacer 154 is disposed in a limited region (a periphery of the red subpixel SP_R), the rise in the low level voltage Vss due to the spacer 154 may be minimized or mitigated.

In FIGS. 4 and 5, an encapsulation layer 160 may be disposed on the cathode 136. The encapsulation layer 160 may include a first encapsulation layer 162 of an inorganic material, a second encapsulation layer 164 of an organic material, and a third encapsulation layer 166 of an inorganic material. Although the inorganic material may include silicon nitride (SiNx) and silicon oxide (SiOx), it is not limited thereto. Although the organic material may include polyethylene terephthalate (PET), polyethylene naphthalate (PEN), polycarbonate (PC), polyimide (PI), polyethylene sulfonate (PES), polyoxymethylene (POM), polyarylate (PAR) and a mixture thereof, it is not limited thereto.

A second substrate 170 may be disposed on and attached to the third encapsulation layer 166 with an adhesive (not shown). The adhesive may include a material having an excellent adhesive force, thermal resistance, and water resistance. For example, the adhesive may include a thermosetting resin, such as an epoxy compound, an acrylate compound, and an acrylic rubber. The adhesive may include a light curable resin, and the adhesive of a light curable resin may be cured by irradiating light, such as an ultra violet ray.

The second substrate 170 as an encapsulation cap may include a protecting film, such as a polystyrene film, a polyethylene film, a polyethylene naphthalate film, and a polyimide film, or a glass of a thickness of about 10 μm to about 99 μm.

In the OLED display device according to a first example embodiment of the present disclosure, the reverse-tapered spacer 154 increasing a length of the current path of the lateral leakage current may be disposed in the periphery of the red subpixel SP_R and not in the periphery of the green and blue subpixels SP_G and SP_B. Thus, the lateral leakage current may be minimized to prevent or reduce non-uniformity of the luminance, and potential deterioration due to a rise in the low level voltage Vss may be prevented or mitigated.

Although the spacer 154 includes the first and second sub-spacers 154*a* and 154*b* in a first example embodiment, the spacer 154 may include one sub-spacer or three or more sub-spacers in other example embodiments.

Figure 7:
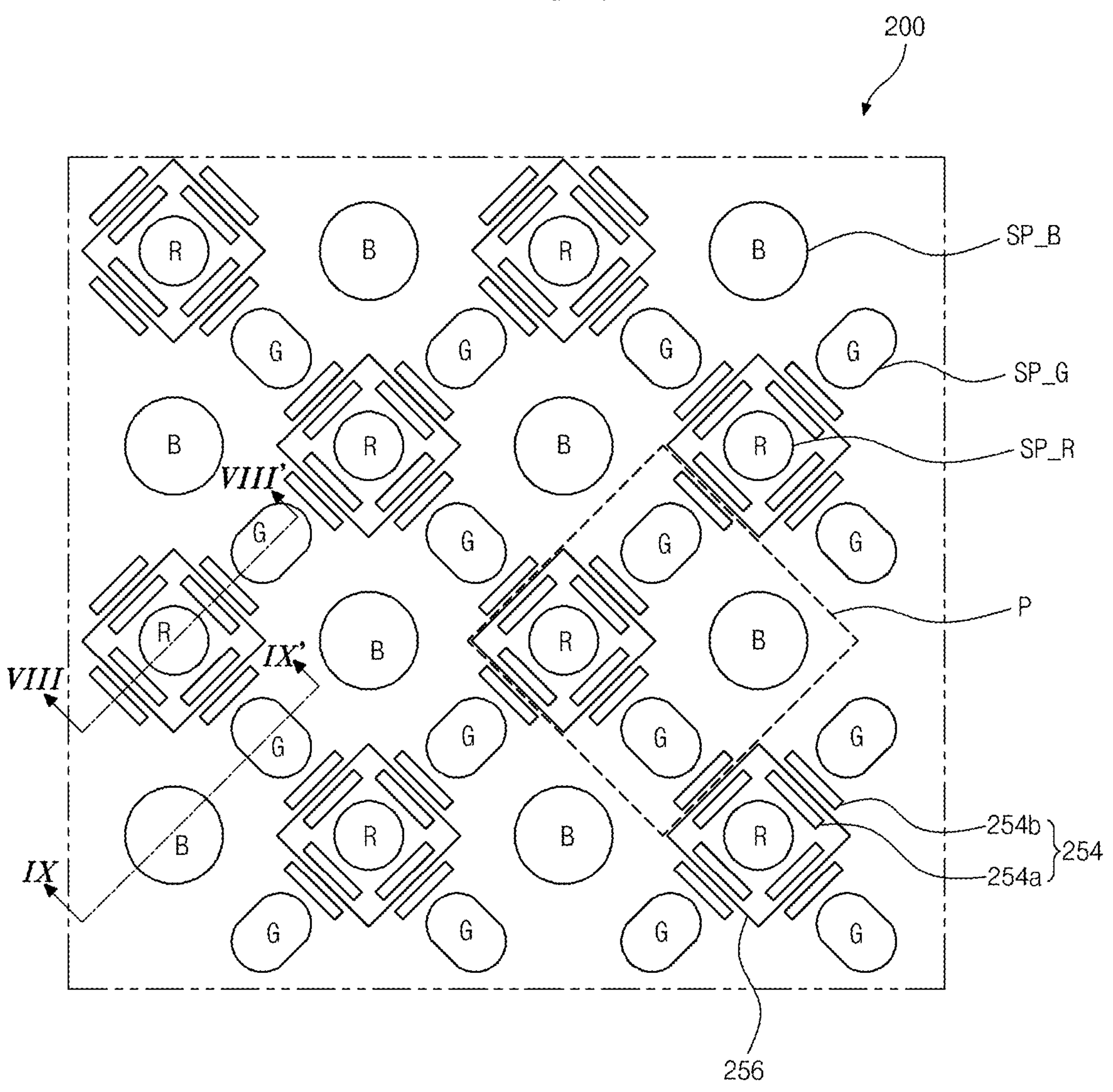
FIG. 7 is a partial plan view showing an organic light emitting diode display device according to a second example embodiment of the present disclosure.
Figure 8:
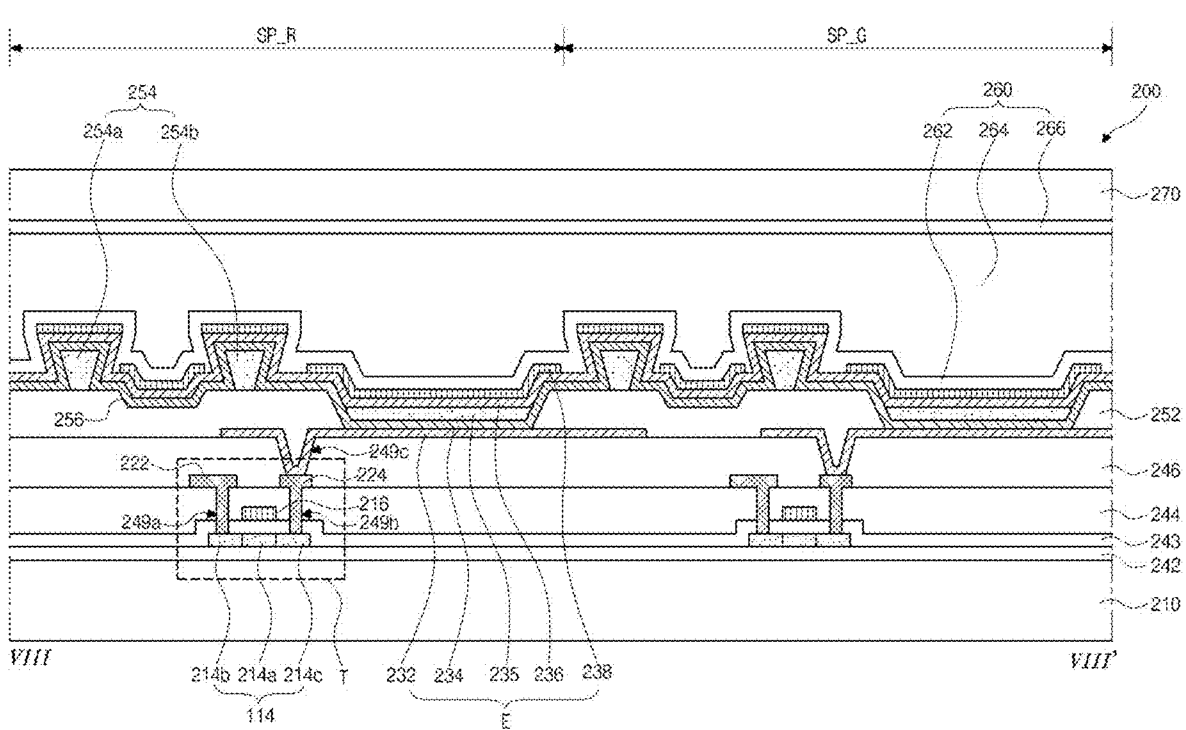
FIG. 8 is a cross-sectional view taken along a line VIII-VIII' of FIG. 7.
Figure 9:
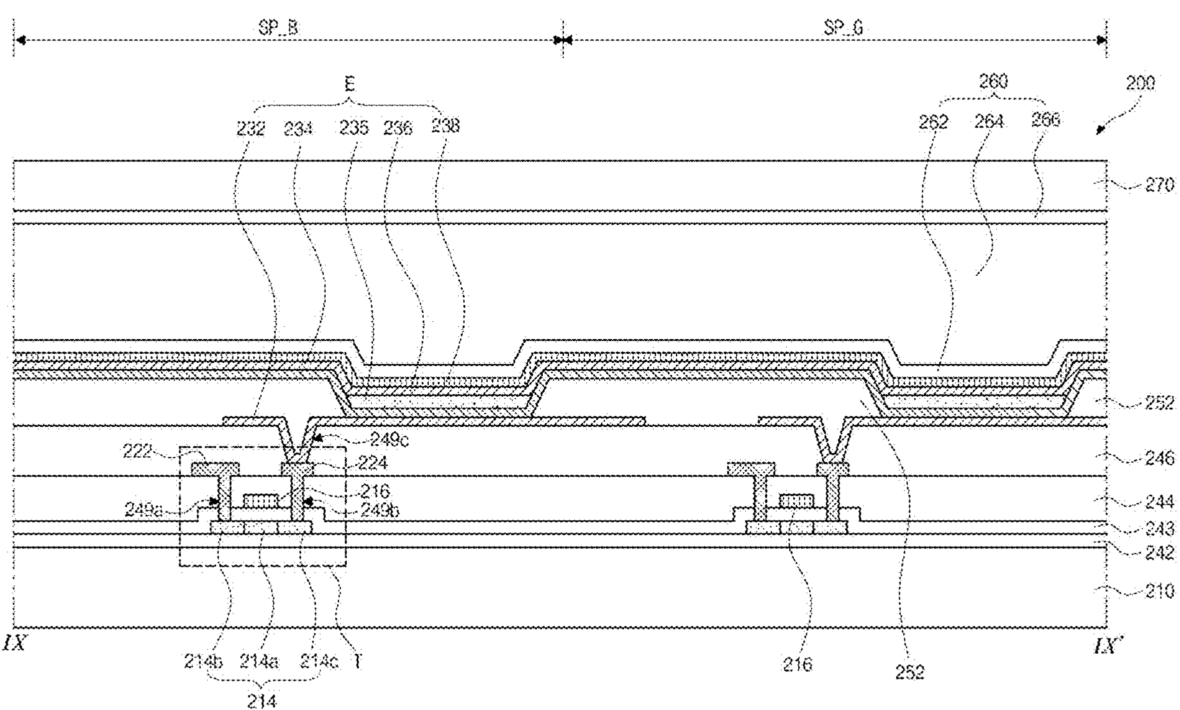
FIG. 9 is a cross-sectional view taken along a line IX-IX' of FIG. 7.

FIG. 7 is a partial plan view showing an organic light emitting diode display device according to a second example embodiment of the present disclosure. FIG. 8 is a cross-sectional view taken along a line VIII-VIII' of FIG. 7. FIG. 9 is a cross-sectional view taken along a line IX-IX' of FIG. 7. Illustration or description of a portion of this example embodiment that is the same as or similar to that of the first embodiment may be omitted.

In FIG. 7, an organic light emitting diode (OLED) display device 200 may include a red subpixel SP_R, a green subpixel SP_G, and a blue subpixel SP_B. A plurality of spacers 254 each having a reverse taper shape in a cross-sectional view may be disposed in a periphery of the red subpixel SP_R, and not in a periphery of the green and blue subpixels SP_G and SP_B.

A groove 256 of a predetermined width may be disposed along a boundary of the red subpixel SP_R to have a closed curve (loop), rectangular, or polygonal shape in a periphery of the red subpixel SP_R. If the spacer 254 includes first and second sub-spacers 254*a* and 254*b*, the groove 256 may be disposed between the first and second sub-spacers 254*a* and 254*b*. In another example embodiment, the groove 256 may be disposed inside the first sub-spacer 254*a* or outside the second sub-spacer 254*b* to surround the red subpixel SP_R.

As shown in FIGS. 8 and 9, a thin film transistor (TFT) T may be disposed on a first substrate 210, and a bank layer 252 may be disposed over the TFT T.

A reverse-tapered spacer 254 may be disposed on the bank layer 252 between the red and green subpixels SP_R and SP_G in a periphery of the red subpixel SP_R. Although the spacer 254 is illustrated as including first and second sub-spacers 254*a* and 254*b* spaced apart from each other in a second example embodiment, the spacer 254 may include one sub-spacer or three or more sub-spacers in other example embodiments.

The groove 256 may be disposed in a periphery of the red subpixel SP_R on the bank layer 252. The groove 256 may be spaced apart from the first and second sub-spacers 254*a* and 254*b* and may have a predetermined width. A sidewall of the groove 256 may have a slanting angle equal to or smaller than about 90 degree to have a taper shape.

Although the groove 256 may be disposed between the first and second sub-spacers 254*a* and 254*b* in a second example embodiment, the groove 256 may alternatively be disposed at an outer side the first and second sub-spacers 254*a* and 254*b* in another example embodiment. Although the groove 256 may have one sub-groove in a second example embodiment, the groove 256 may have two or more sub-grooves in another example embodiment. For example, a plurality of sub-grooves may be disposed between the first and second sub-spacers 254*a* and 254*b* or may be disposed at ab outer side the first and second sub-spacers 254*a* and 254*b*.

The spacer 254 may include the same material as the bank layer 252 or may have a different material from the bank layer 252. For example, if the spacer 254 and the bank layer 252 include the same material as each other, the spacer 254 and the bank layer 252 may be formed through a single mask process. Further, the spacer 254, the bank layer 252, and the groove 256 may be formed through a single mask process.

An anode 232 may be disposed on a passivation layer 246 between the adjacent bank layers 252 and may be electrically connected to a drain electrode 224 of the TFT T through a third contact hole 249*c* in the passivation layer 246.

A hole transporting layer 234 may be disposed on the anode 232 between the adjacent bank layers 252, on a top surface of the bank layer 252, on side and top surfaces of the spacer 254, and on side and bottom surfaces of the groove 256. An emitting layer 235 may be disposed on the hole transporting layer 234 between the adjacent bank layers 252. The emitting layer 235 may include a red emitting layer emitting a red colored light in the red subpixel SP_R, a green emitting layer emitting a green colored light in the green subpixel SP_G, and a blue emitting layer emitting a blue colored light in the blue subpixel SP_B. Alternatively, the emitting layer 235 may include a white emitting layer emitting a white colored light in the red, green, and blue subpixels SP_R, SP_G, and SP_B. Also, in one or more of the red, green, and blue subpixels SP_R, SP_G, and SP_B, two or more stacks of emitting layers 235 overlapping one another may be disposed on the hole transporting layer 234 between the adjacent bank layers 252, with a charge generation layer (not shown) interposed between the two or more stacks of emitting layers 235.

An electron transporting layer 236 may be disposed on the emitting layer 235 between the adjacent bank layer 252, on the hole transporting layer 234 over the top surface of the bank layer 252, on the hole transporting layer 234 over the side and top surfaces of the spacer 254, and on the hole transporting layer 234 over the side and bottom surfaces of the groove 256.

A cathode 238 may be disposed on the electron transporting layer 236 between the adjacent bank layers 252, on the electron transporting layer 236 over the top surface of the bank layer 252, on the electron transporting layer 236 over the top surface of the spacer 254, and on the electron transporting layer 236 over the side and bottom surfaces of the groove 256. The cathode 238 may not also be disposed on the electron transporting layer 236 over the side surface of the spacer 254. Although the cathode 238 may be disposed over the top surface of the bank layer 252, the top surface of the spacer 254, and an inner surface of the groove 256, the cathode 238 may not also be disposed over the side surface of the reverse-tapered spacer 254. As a result, a portion of the cathode 238 over the top surface of the bank layer 252 and a portion of the cathode 238 over the top surface of the spacer 254 may be disconnected from each other due to the side surface of the reverse-tapered spacer 254.

Although not shown, a hole injecting layer may be disposed between the anode 232 and the hole transporting layer 234, and an electron injecting layer may be disposed on the electron transporting layer 236.

In the OLED display device 200 according to a second example embodiment of the present disclosure, since the hole transporting layer 234 and the electron transporting layer 236 may be disposed on the side and top surfaces of the spacer 254 and the side and bottom surfaces of the groove 256, the hole transporting layer 234 and the electron transporting layer 236 may be disposed on an entire surface of the OLED display device 200. The cathode 238 may be cut into discontinuous segments due to the spacer 254.

As a result, since a current path of a lateral leakage current of the hole transporting layer 234 and the electron transporting layer 236 may be disposed on the side and top surfaces of the spacer 254, the current path of the lateral leakage current may be elongated. As a result, the lateral leakage current transmitted to the adjacent subpixel may be minimized due to an increase in the length of the current path. In addition, since the current path of the lateral leakage current may be further elongated due to the groove 256, the lateral leakage current transmitted to the adjacent subpixel may be further reduced.

Figure 10:
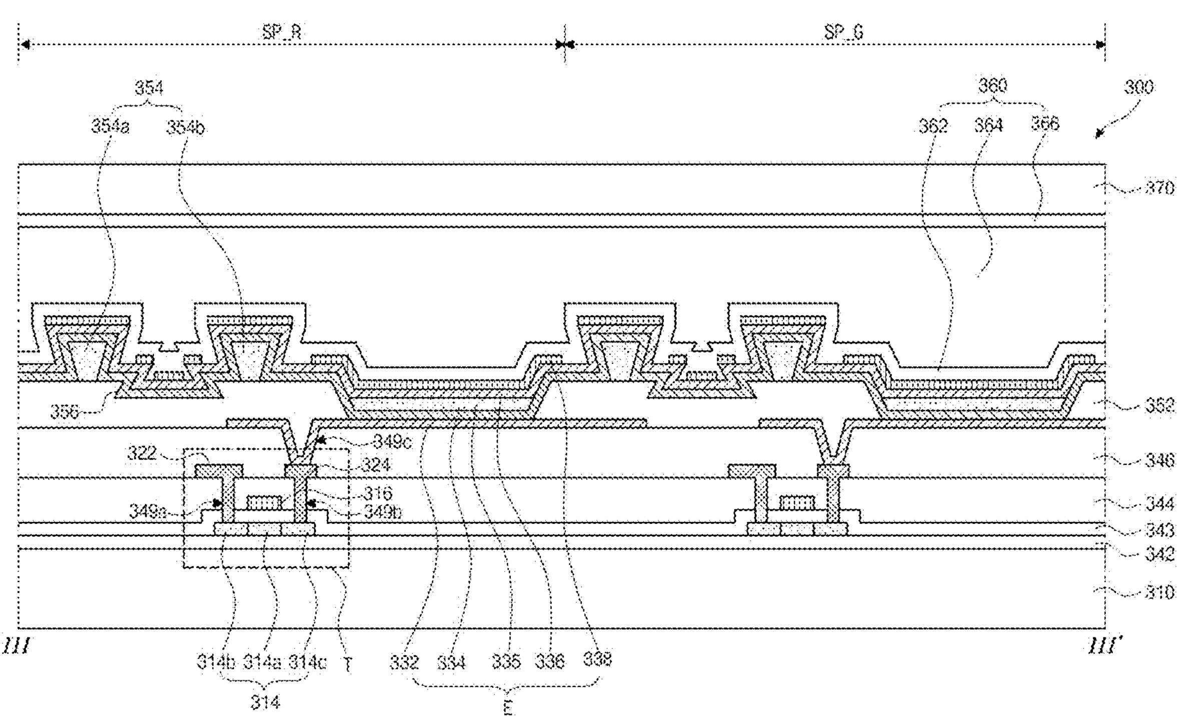
FIG. 10 is a cross-sectional view showing an organic light emitting diode display device according to a third example embodiment of the present disclosure corresponding a line VIII-VIII' of FIG. 7.
Figure 11:
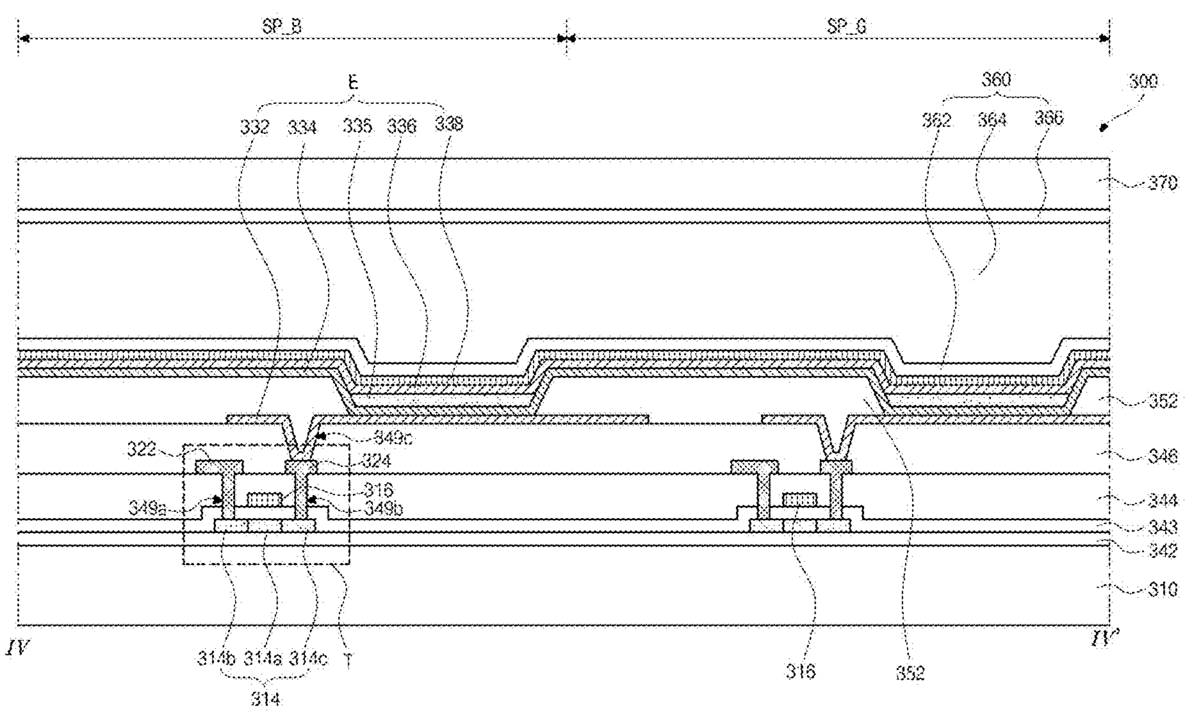
FIG. 11 a cross-sectional view showing an organic light emitting diode display device according to a third example embodiment of the present disclosure corresponding to a line IX-IX' of FIG. 7.

FIGS. 10 and 11 are cross-sectional views showing an organic light emitting diode display device according to a third example embodiment of the present disclosure. FIG. 10 corresponds to a cross-sectional view taken along a line VIII-VIII' of FIG. 7, and FIG. 11 corresponds to a cross-sectional view taken along a line IX-IX' of FIG. 7. Illustration or description of a portion of this example embodiment that is the same as or similar to that of either of the first and second embodiments may be omitted.

As shown in FIGS. 10 and 11, a thin film transistor (TFT) T of an organic light emitting diode (OLED) display device 300 according to a third example embodiment of the present disclosure may be disposed on a first substrate 310, and a bank layer 352 may be disposed over the TFT T.

A reverse-tapered spacer 354 may be disposed on the bank layer 352 between red and green subpixels SP_R and SP_G in a periphery of the red subpixel SP_R. Although the spacer 354 is illustrated as including first and second sub-spacers 354*a* and 354*b* spaced apart from each other in a third example embodiment, the spacer 354 may include one sub-spacer or three or more sub-spacers in other example embodiments.

Figure 13A:
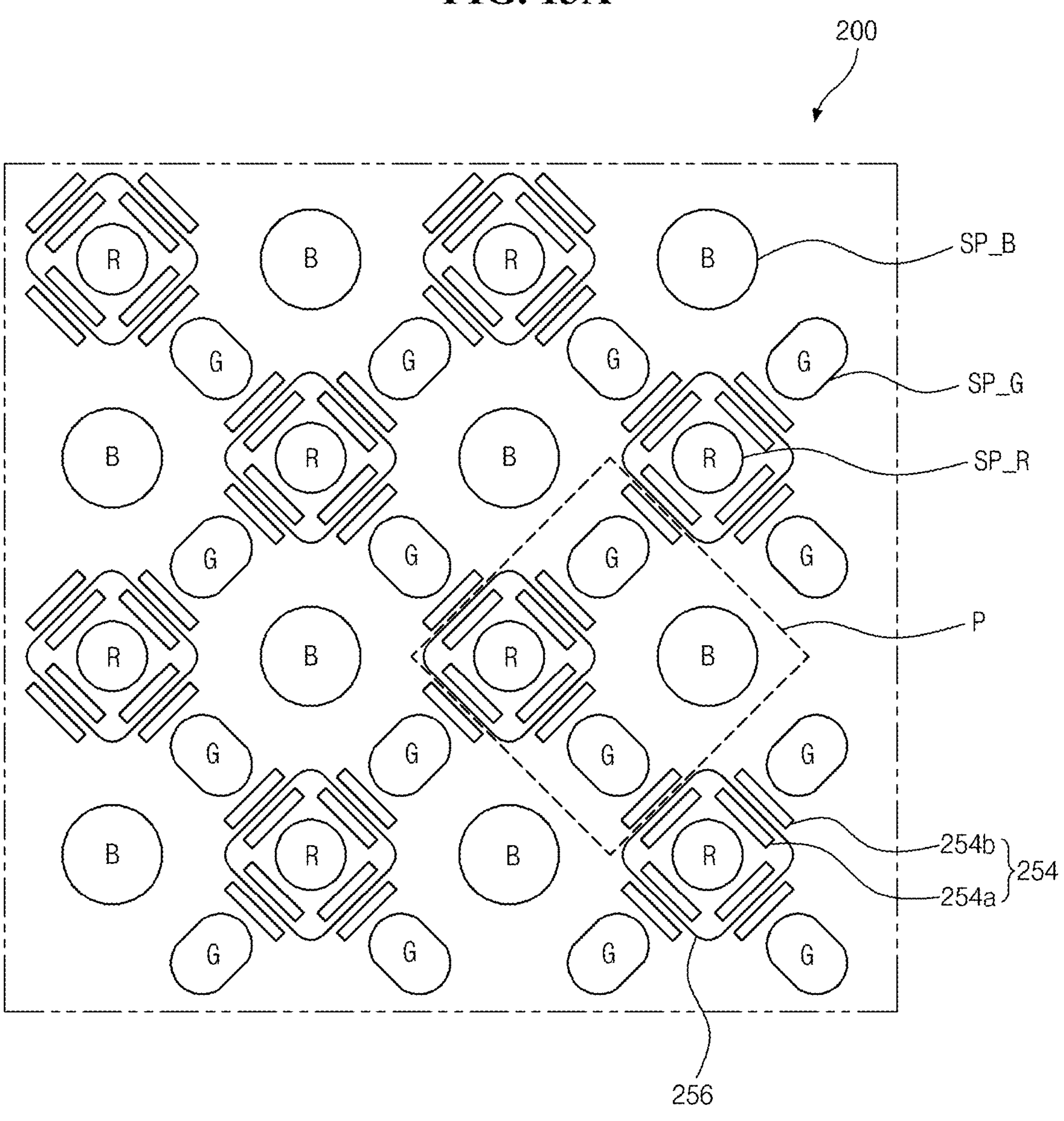
FIGS. 13A and 13B are plan views illustrating alternative example shapes of the groove around a red (R) subpixel shown in FIG. 7.
Figure 13B:
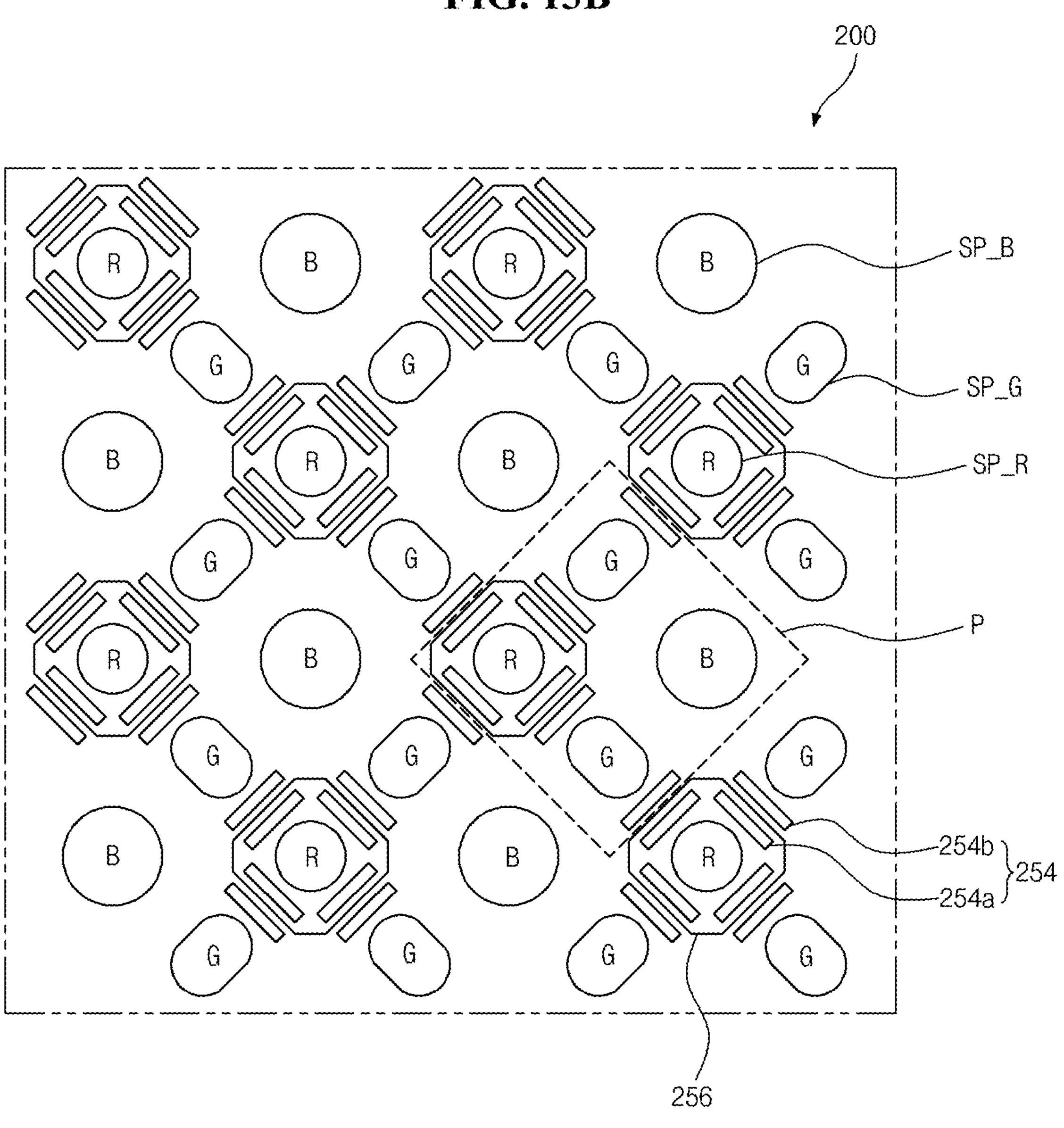

A groove 356 having a closed curve (loop), rectangular, or polygonal shape of a predetermined width may be disposed in a periphery of the red subpixel SP_R on the bank layer 352. See FIGS. 7, 13A, and 13B. For example, as shown in FIGS. 7, 13A, and 13B, the groove 356 may form a closed loop which surrounds the red subpixel. The groove 356 may be spaced apart from the first and second sub-spacers 354*a* and 354*b*. A sidewall of the groove 356 may have a slanting angle equal to or greater than about 90 degree to have a reverse taper shape.

Although the groove 356 may be disposed between the first and second sub-spacers 354*a* and 354*b* in a third example embodiment, the groove 356 may alternative be disposed at an outer side the first and second sub-spacers 354*a* and 354*b* in another example embodiment. Although the groove 356 may have one sub-groove in a third example embodiment, the groove 356 may have two or more sub-grooves in another example embodiment. For example, a plurality of sub-grooves may be disposed between the first and second sub-spacers 354*a* and 354*b* or may be disposed at an outer side the first and second sub-spacers 354*a* and 354*b*.

An anode 332 may be disposed on a passivation layer 346 between the adjacent bank layers 352 and may be electrically connected to a drain electrode 324 of the TFT T through a third contact hole 349*c* in the passivation layer 346.

A hole transporting layer 334 may be disposed on the anode 332 between the adjacent bank layers 352, on a top surface of the bank layer 352, on side and top surfaces of the spacer 354, and on side and bottom surfaces of the groove 356. An emitting layer 335 may be disposed on the hole transporting layer 334 between the adjacent bank layers 352. The emitting layer 335 may include a red emitting layer emitting a red colored light in the red subpixel SP_R, a green emitting layer emitting a green colored light in the green subpixel SP_G, and a blue emitting layer emitting a blue colored light in the blue subpixel SP_B. Alternatively, the emitting layer 335 may include a white emitting layer emitting a white colored light in the red, green, and blue subpixels SP_R, SP_G, and SP_B. Also, in one or more of the red, green, and blue subpixels SP_R, SP_G, and SP_B, two or more stacks of emitting layers 335 overlapping one another may be disposed on the hole transporting layer 334 between the adjacent bank layers 352, with a charge generation layer (not shown) interposed between the two or more stacks of emitting layers 335.

An electron transporting layer 336 may be disposed on the emitting layer 335 between the adjacent bank layer 352, on the hole transporting layer 334 over the top surface of the bank layer 352, on the hole transporting layer 334 over the side and top surfaces of the spacer 354, and on the hole transporting layer 334 over the side and bottom surfaces of the groove 356.

A cathode 338 may be disposed on the electron transporting layer 336 between the adjacent bank layers 352, on the electron transporting layer 336 over the top surface of the bank layer 352, on the electron transporting layer 336 over the top surface of the spacer 354, and on the electron transporting layer 336 over the bottom surface of the groove 356. The cathode 338 may not also be disposed on the electron transporting layer 336 over the side surface of the spacer 354 and on the side surface of the groove 356. Although the cathode 338 may be disposed over the top surface of the bank layer 352, on the top surface of the spacer 354, and on the bottom surface of the groove 356, the cathode 338 may not also be disposed over the side surface of the reverse-tapered spacer 354 and on the side surface of the reverse-tapered groove 356. As a result, a portion of the cathode 338 over the top surface of the bank layer 352 and a portion of the cathode 338 over the top surface of the spacer 354 may be cut and disconnected from each other due to the side surface of the reverse-tapered spacer 354. Also, the portion of the cathode 338 over the top surface of the bank layer 352 and a portion of the cathode 338 over the bottom surface of the groove 356 may be cut and disconnected due to the side surface of the reverse-tapered groove 356.

In the OLED display device 300 according to a third example embodiment of the present disclosure, since the hole transporting layer 334 and the electron transporting layer 336 are disposed on the side and top surfaces of the spacer 354 and the side and bottom surfaces of the groove 356, the hole transporting layer 334 and the electron transporting layer 336 may be disposed on an entire surface of the OLED display device 300. As a result, a current path of a lateral leakage current may be elongated, and the lateral leakage current transmitted to the adjacent subpixel may be reduced due to an increase in the length of the current path.

In addition, since the cathode 338 may be cut into discontinuous segments due to the side surface of the groove 356 as well as the side surface of the spacer 354, a current path of a low level voltage Vss may be minimized, and potential deterioration due to a rise in the low level voltage Vss may be prevented or mitigated.

Although the light emitting diode E has a one-stack structure in the first to third embodiment, the light emitting diode E may have a two-stack structure in another embodiment.

Figure 12:
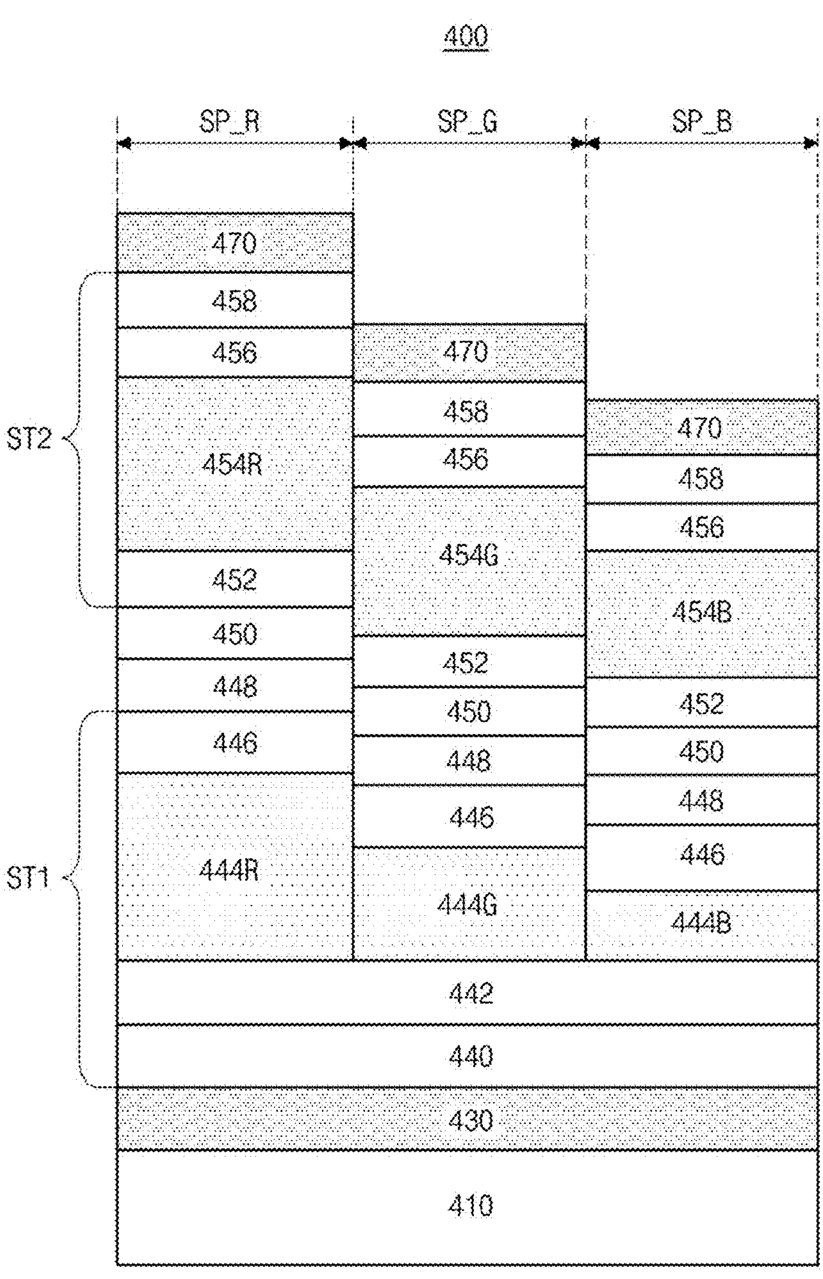
FIG. 12 is a view showing an organic light emitting diode display device according to a fourth embodiment of the present disclosure.

FIG. 12 is a view showing an organic light emitting diode display device according to a fourth embodiment of the present disclosure. A part of the fourth embodiment the same as the first to third embodiments will be omitted.

In FIG. 12, an organic light emitting diode (OLED) display device 400 according to a fourth embodiment of the present disclosure may include red, green and blue subpixels SP_R, SP_G and SP_B.

An anode 430 is disposed in each of the red, green and blue subpixels SP_R, SP_G and SP_B on a substrate 410. A hole injecting layer (HIL) 440 is disposed in a whole of the red, green and blue subpixels SP_R, SP_G and SP_B on the anode 430, and a first hole transporting layer (HTL) 442 is disposed in a whole of the red, green and blue subpixels SP_R, SP_G and SP_B on the HIL 440.

In another embodiment, a positive type hole transporting layer (P-HTL) instead of the HIL 440 may be disposed between the anode 430 and the first HTL 442.

A first red emitting material layer (EML) 444R is selectively disposed in the red subpixel SP_R on the first HTL 442, a first green EML 444G is selectively disposed in the green subpixel SP_G on the first HTL 442, and a first blue EML 444B is selectively disposed in the blue subpixel SP_B on the first HTL 442.

The first red, green and blue EMLs 444R, 444G and 444B may adjust a length of an optical path in the red, green and blue subpixels SP_R, SP_G and SP_B to obtain a micro cavity. For example, a thickness of the first green EML 444G may be greater than or equal to a thickness of the first blue EML 444B and may be smaller than or equal to a thickness of the first red EML 444R.

A first electron transporting layer (ETL) 446 is disposed on a whole of the first red EML 444R of the red subpixel SP_R, the first green EML 444G of the green subpixel SP_G and the first blue EML 444B of the blue subpixel SP_B.

The HIL 440, the first HTL 442, the first red, green and blue EMLs 444R, 444G and 444B and the first ETL 446 constitute a first stack ST1.

An N type charge generation layer (CGL) 448 is disposed on the first ETL 446 in the red, green and blue subpixels SP_R, SP_G and SP_B, and a P type CGL 450 is disposed on the N type CGL 448 in the red, green and blue subpixels SP_R, SP_G and SP_B.

The N type CGL 448 and the P type CGL 450 may generate and supply an electron and a hole. For example, the N type CGL 448 may supply an electron to the first stack ST1, and the P type CGL 450 may supply a hole to a second stack ST2.

A second HTL 452 is disposed on the P type CGL 450 in the red, green and blue subpixels SP_R, SP_G and SP_B.

A second red EML 454R is selectively disposed in the red subpixel SP_R on the second HTL 452, a second green EML 454G is selectively disposed in the green subpixel SP_G on the second HTL 452, and a first blue EML 454B is selectively disposed in the blue subpixel SP_B on the second HTL 452.

The second red, green and blue EMLs 454R, 454G and 454B may adjust a length of an optical path in the red, green and blue subpixels SP_R, SP_G and SP_B to obtain a micro cavity. For example, a thickness of the second green EML 454G may be greater than or equal to a thickness of the second blue EML 454B and may be smaller than or equal to a thickness of the second red EML 454R.

A second ETL 456 is disposed on a whole of the second red EML 454R of the red subpixel SP_R, the second green EML 454G of the green subpixel SP_G and the second blue EML 454B of the blue subpixel SP_B.

An electron injecting layer (EIL) 458 is disposed on the second ETL 456 in the red, green and blue subpixels SP_R, SP_G and SP_B.

The second HTL 452, the second red, green and blue EMLs 454R, 454G and 454B, the second ETL 456 and the EIL 458 constitute a second stack ST2.

A cathode 470 is disposed on the EIL 458 in the red, green and blue subpixels SP_R, SP_G and SP_B.

The anode 430, the first stack ST1, the N type CGL 448, the P type CGL 450, the second stack ST2 and the cathode 470 may constitute a light emitting diode.

In another embodiment, the light emitting diode E may have a three-stack structure.

Consequently, in the OLED display device according to example embodiments of the present disclosure, the spacer may be disposed in the periphery of the red subpixel, which may be subject to a relatively large influence by the lateral leakage current. On the other hand, the spacer may not also be disposed in the periphery of the green and blue subpixels, which may be subject to a relatively small amount of influence by the lateral leakage current. As a result, potential deterioration due to the lateral leakage current may effectively be prevented or mitigated.

Further, since the spacer is disposed only in the periphery of the red subpixel, which may be subject to a relatively large maximum influence by the lateral leakage current, the potential rise in the low level voltage due to the spacer may be minimized or reduced.

Example embodiments of the present disclosure can also be described as follows:

According to an example embodiment of a present disclosure, a display device may include: a first substrate; a bank layer on the first substrate to define red, green, and blue subpixels; a thin film transistor in each of the red, green, and blue subpixels; a light emitting diode in the red subpixel; and a plurality of spacers on the bank layer in a periphery of the red subpixel. The light emitting diode may include an anode, a hole transporting layer, an emitting layer, an electron transporting layer, and a cathode. Each of the plurality of spacers may have a reverse taper shape. The hole transporting layer and the electron transporting layer may extend to an adjacent subpixel through side and top surfaces of each of the plurality of spacers. The cathode may be discontinuous at the side surface of each of the plurality of spacers.

In some example embodiments, the plurality of spacers may be spaced apart from each other in the periphery of the red subpixel to surround the red subpixel.

In some example embodiments, each of the plurality of spacers may include a plurality of sub-spacers spaced apart from each other.

In some example embodiments, the display device may further include a groove in the bank layer in the periphery of the red subpixel. The hole transporting layer, the electron transporting layer, and the cathode may be disposed in the groove. The hole transporting layer and the electron transporting layer may be disposed on side and bottom surfaces of the groove.

In some example embodiments, the groove may have a closed loop, rectangular, or polygonal shape surrounding the red subpixel.

In some example embodiments, a sidewall of the groove may have a reverse taper shape, and the cathode may be discontinuous at one or more side surfaces of the groove.

In some example embodiments, the green subpixel and the blue subpixel may be adjacent to each other and each may include a light emitting diode having an anode, an emitting layer, and a cathode. The cathode in the green subpixel may be connected to and continuous with the cathode in the blue subpixel.

In some example embodiments, the adjacent subpixel may be the green subpixel, and the cathode in the red subpixel may be disconnected from the cathode in the green subpixel.

In some example embodiments, the cathode in the green subpixel may extend over the bank layer between the green subpixel and the blue subpixel and may be connected to the cathode in the blue subpixel.

In some example embodiments, the spacer may be widest at the top surface and may gradually narrow toward the bank layer. At least one of the side surfaces of the spacer may be inclined at an angle less than 90° with respect to the top surface of the spacer.

According to another example embodiment of the present disclosure, a display device having a plurality of subpixels may include: a first substrate; a bank layer on the first substrate at boundaries between the plurality of subpixels; a thin film transistor in one of the subpixels; a light emitting diode in the one of the subpixels and electrically connected to the thin film transistor, the light emitting diode including an anode, a hole transporting layer, a first emitting layer, an electron transporting layer, and a cathode; and a spacer on the bank layer at a periphery of the one of the subpixels, the spacer having a reverse taper shape. The cathode may include at least two discontinuous segments disconnected from each other at one or more side surfaces of the spacer.

In some example embodiments, the hole transporting layer and the electron transporting layer may extend over the side surfaces and a top surface of the spacer to an adjacent subpixel among the plurality of the subpixels.

In some example embodiments, the light emitting diode may include at least two stacks of emitting layers overlapping one another, the at least two stacks of emitting layers including the first emitting layer.

In some example embodiments, the light emitting diode may further include a charge generation layer between the at least two stacks of emitting layers.

In some example embodiments, the one of the subpixels may be a red subpixel.

In some example embodiments, at least four subpixels among the plurality of subpixels may form a pixel. At least two of the at least four subpixels may be of a same color.

In some example embodiments, a distance between the red subpixel and the blue subpixel may be different from a distance between the red subpixel and the green subpixel, or the distance between the red subpixel and the blue subpixel may be different from a distance between the green subpixel and the blue subpixel.

In some example embodiments, the display device may further include a groove in the bank layer in the periphery of the red subpixel. The hole transporting layer, the electron transporting layer, and the cathode may be disposed in the groove. The hole transporting layer and the electron transporting layer may be disposed on side and bottom surfaces of the groove.

In some example embodiments, the groove may have a closed loop, rectangular, or polygonal shape surrounding the red subpixel.

In some example embodiments, a sidewall of the groove may have a reverse taper shape, and the cathode may be discontinuous at one or more side surfaces of the groove.

According to yet another example embodiment of the present disclosure, a display device having a plurality of subpixels may include: a first substrate; a bank layer on the first substrate at boundaries between the plurality of subpixels, the bank layer including a groove at a top surface of the bank layer in a periphery of one of the subpixels; a thin film transistor in the one of the subpixels; a first light emitting diode in the one of the subpixels and electrically connected to the thin film transistor, the first light emitting diode including an anode, an emitting layer, and a cathode. At least one of the anode and the cathode may extend on the bank layer, including side and bottom surfaces of the groove, to be connected to an adjacent one of the subpixels.

In some example embodiments, the light emitting diode may further include a hole transporting layer and an electron transporting layer. At least one of the hole transporting layer and the electron transporting layer may extend on the bank layer, including side and bottom surfaces of the groove, to be connected to the adjacent one of the subpixels.

In some example embodiments, the display device may further include: a spacer on the bank layer at a periphery of the one of the subpixels, the spacer having a reverse taper shape. The at least one of the hole transporting layer and the electron transporting layer may extend over side surfaces and a top surface of the spacer to the adjacent one of the subpixels.

In some example embodiments, the light emitting diode may include at least two stacks of emitting layers overlapping one another, the at least two stacks of emitting layers including the first emitting layer.

In some example embodiments, the light emitting diode may further include a charge generation layer between the at least two stacks of emitting layers.

In some example embodiments, the one of the subpixels may be a red subpixel.

In some example embodiments, at least four subpixels among the plurality of subpixels may form a pixel. At least two of the at least four subpixels may be of a same color.

In some example embodiments, a distance between the red subpixel and the blue subpixel may be different from a distance between the red subpixel and the green subpixel, or the distance between the red subpixel and the blue subpixel may be different from a distance between the green subpixel and the blue subpixel.

In some example embodiments, the groove may have a closed loop, rectangular, or polygonal shape surrounding the red subpixel.

In some example embodiments, a sidewall of the groove may have a reverse taper shape, and the cathode may be discontinuous at one or more side surfaces of the groove.

It will be apparent to those skilled in the art that various modifications and variation can be made in the present disclosure without departing from the scope of the disclosure. Thus, it is intended that the present disclosure cover the modifications and variations of this disclosure, provided they come within the scope of the appended claims and their equivalents.

What is claimed is:

1. A display device, comprising:
- a first substrate;
- a bank layer on the first substrate to define red, green, and blue subpixels;
- a thin film transistor in each of the red, green, and blue subpixels;
- a light emitting diode in the red subpixel; and
- a plurality of spacers on the bank layer in a periphery of the red subpixel,
- wherein the light emitting diode includes an anode, a hole transporting layer, an emitting layer, an electron transporting layer, and a cathode,
- wherein each of the plurality of spacers has a reverse taper shape,
- wherein the hole transporting layer and the electron transporting layer extend to an adjacent subpixel through side and top surfaces of each of the plurality of spacers,
- wherein the cathode is discontinuous at the side surface of each of the plurality of spacers and does not cover at least a portion of the side surface of at least one of the plurality of spacers, and
- wherein the plurality of spacers are disposed between the red subpixel and the green subpixel and between the red subpixel and the blue subpixel, and the plurality of spacers are not disposed between the green subpixel and the blue subpixel.

2. The display device of claim 1, wherein the plurality of spacers are spaced apart from each other in the periphery of the red subpixel to surround the red subpixel.

3. The display device of claim 2, wherein each of the plurality of spacers includes a plurality of sub-spacers spaced apart from each other.

4. The display device of claim 1, further comprising a groove in the bank layer in the periphery of the red subpixel,
- wherein the hole transporting layer, the electron transporting layer, and the cathode are disposed in the groove, and
- wherein the hole transporting layer and the electron transporting layer are disposed on one or more side surfaces and a bottom surface of the groove.

5. The display device of claim 4, wherein the groove has a closed loop, rectangular, or polygonal shape surrounding the red subpixel.

6. The display device of claim 4, wherein the groove has a reverse taper shape, and the cathode is discontinuous at the one or more side surfaces of the groove.

7. The display device of claim 1, wherein:
the green subpixel and the blue subpixel are next to each other, and each include a light emitting diode having an anode, an emitting layer, and a cathode; and
the cathode in the green subpixel is connected to and continuous with the cathode in the blue subpixel.

8. The display device of claim 7, wherein:
the adjacent subpixel to the red subpixel is the green subpixel; and
the cathode in the red subpixel is disconnected from the cathode in the green subpixel.

9. The display device of claim 7, wherein the cathode in the green subpixel extends over the bank layer between the green subpixel and the blue subpixel and is connected to the cathode in the blue subpixel.

10. The display device of claim 1, wherein the spacer is widest at the top surface and gradually narrows toward the bank layer, and
wherein at least one of the side surfaces of the spacer is inclined at an angle less than 90° with respect to the top surface of the spacer.

11. The display device of claim 1, wherein the electron transporting layer on the side surface of each of the plurality of spacers is exposed between the cathode on the top surface of each of the plurality of spacers and the cathode on a top surface of the bank layer.

12. The display device of claim 1, wherein the hole transporting layer and the electron transporting layer have an uneven shape on the bank layer between the red subpixel and the green subpixel and between the red subpixel and the blue subpixel, and the hole transporting layer and the electron transporting layer have a flat shape on the bank layer between the green subpixel and the blue subpixel.

13. A display device having a plurality of subpixels, the display device comprising:
a first substrate;
a bank layer on the first substrate at boundaries between the plurality of subpixels;
a thin film transistor in one of the subpixels;
a light emitting diode in the one of the subpixels and electrically connected to the thin film transistor, the light emitting diode including an anode, a hole transporting layer, a first emitting layer, an electron transporting layer, and a cathode; and
a spacer on the bank layer at a periphery of the one of the subpixels, the spacer having a reverse taper shape,
wherein the cathode includes at least two discontinuous segments disconnected from each other at one or more side surfaces of the spacer, and the cathode does not cover at least a portion of the one or more side surfaces of the spacer, and
wherein the spacer is disposed between the one of the subpixels and one other of the subpixels, and the spacer is not disposed between two of the subpixels other than the one of the subpixels.

14. The display device of claim 13, wherein the hole transporting layer and the electron transporting layer extend over the one or more side surfaces and a top surface of the spacer to an adjacent subpixel among the plurality of subpixels.

15. The display device of claim 13, wherein the light emitting diode includes at least two stacks of emitting layers overlapping one another, the at least two stacks of emitting layers including the first emitting layer.

16. The display device of claim 15, wherein the light emitting diode further includes a charge generation layer between the at least two stacks of emitting layers.

17. The display device of claim 13, wherein the one of the subpixels is a red subpixel.

18. The display device of claim 13, wherein at least four subpixels among the plurality of subpixels form a pixel, and
wherein at least two of the at least four subpixels are of a same color.

19. The display device of claim 13, wherein a distance between the red subpixel and the blue subpixel is different from a distance between the red subpixel and the green subpixel, or the distance between the red subpixel and the blue subpixel is different from a distance between the green subpixel and the blue subpixel.

20. The display device of claim 13, further comprising a groove in the bank layer in the periphery of the red subpixel,
wherein the hole transporting layer, the electron transporting layer, and the cathode are disposed in the groove, and
wherein the hole transporting layer and the electron transporting layer are disposed on one or more side surfaces and a bottom surface of the groove.

21. The display device of claim 20, wherein the groove has a closed loop, rectangular, or polygonal shape surrounding the red subpixel.

22. The display device of claim 20, wherein the groove has a reverse taper shape, and the cathode is discontinuous at the one or more side surfaces of the groove.

23. A display device having a plurality of subpixels, the display device comprising:
a first substrate;
a bank layer on the first substrate at boundaries between the plurality of subpixels, the bank layer including a groove at a top surface of the bank layer in a periphery of one of the subpixels, the groove having a reverse taper shape;
a thin film transistor in the one of the subpixels; and
a first light emitting diode in the one of the subpixels and electrically connected to the thin film transistor, the first light emitting diode including an anode, a hole transporting layer, an emitting layer, an electron transporting layer, and a cathode,
wherein at least one of the hole transporting layer and the electron transporting layer extends on the bank layer, including one or more side surfaces and a bottom surface of the groove, to be connected to an adjacent one of the subpixels,
wherein the cathode is discontinuous at the one or more side surfaces of the groove, and
wherein the groove is disposed between the one of the subpixels and one other of the subpixels, and the groove is not disposed between two of the subpixels other than the one of the subpixels.

24. The display device of claim 23, wherein both of the hole transporting layer and the electron transporting layer extend on the bank layer, including the one or more side surfaces and the bottom surface of the groove, to be connected to the adjacent one of the subpixels.

25. The display device of claim 23, further comprising:
a spacer on the bank layer at a periphery of the one of the subpixels, the spacer having a reverse taper shape,
wherein the at least one of the hole transporting layer and the electron transporting layer extends over side surfaces and a top surface of the spacer to the adjacent one of the subpixels.

26. The display device of claim 23, wherein the light emitting diode includes at least two stacks of emitting layers overlapping one another, the at least two stacks of emitting layers including the first emitting layer.

27. The display device of claim 26, wherein the light emitting diode further includes a charge generation layer between the at least two stacks of emitting layers.

28. The display device of claim 23, wherein the one of the subpixels is a red subpixel.

29. The display device of claim 23, wherein at least four subpixels among the plurality of subpixels form a pixel, and wherein at least two of the at least four subpixels are of a same color.

30. The display device of claim 23, wherein a distance between the red subpixel and the blue subpixel is different from a distance between the red subpixel and the green subpixel, or the distance between the red subpixel and the blue subpixel is different from a distance between the green subpixel and the blue subpixel.

31. The display device of claim 23, wherein the groove has a closed loop, rectangular, or polygonal shape surrounding the red subpixel.

32. The display device of claim 23, wherein the cathode does not cover the one or more side surfaces of the groove and does not cover at least a portion of the bottom surface of the groove.

33. The display device of claim 23, wherein the electron transporting layer on the side surface of the groove is exposed between the cathode on the bottom surface of the groove and the cathode on a top surface of the bank layer.

* * * * *